(12) United States Patent
Kawai

(10) Patent No.: US 7,404,522 B2
(45) Date of Patent: Jul. 29, 2008

(54) INFORMATION CARRIER, INFORMATION RECORDING MEDIUM, SENSOR, COMMODITY MANAGEMENT METHOD

(75) Inventor: Wakahiro Kawai, Kyoto (JP)

(73) Assignee: Omron Corporation, Kyoto (JP)

( * ) Notice: Subject to any disclaimer, the term of this patent is extended or adjusted under 35 U.S.C. 154(b) by 0 days.

(21) Appl. No.: 10/557,789

(22) PCT Filed: May 26, 2004

(86) PCT No.: PCT/JP2004/007195

§ 371 (c)(1),
(2), (4) Date: Dec. 15, 2006

(87) PCT Pub. No.: WO2004/104912

PCT Pub. Date: Dec. 2, 2004

(65) Prior Publication Data

US 2007/0095922 A1 May 3, 2007

(30) Foreign Application Priority Data

May 26, 2003 (JP) ............................. 2003-147886
May 26, 2004 (JP) ............................. 2004-155697

(51) Int. Cl.
*G06K 19/06* (2006.01)

(52) U.S. Cl. ...................................... 235/492; 235/487
(58) Field of Classification Search ................. 235/492, 235/487; 340/571
See application file for complete search history.

(56) References Cited

U.S. PATENT DOCUMENTS 5,767,772 A * 6/1998 Lemaire et al. ............. 340/571

FOREIGN PATENT DOCUMENTS

| JP | 2000-57292 | 2/2000 |
| JP | 2000-151459 | 5/2000 |
| JP | 2003-76974 | 3/2003 |

* cited by examiner

*Primary Examiner*—Lisa M Caputo
(74) *Attorney, Agent, or Firm*—Dickstein Shapiro LLP

(57) ABSTRACT

An information carrier in which the substrate, having a signal-forming portion for forming signals corresponding to specific information, is attached to a base material having a transfer portion for transferring signals. The specific information is recognized using signals transferred from the signal-forming portion through the transfer portion. The surface attached to the substrate is the surface for attaching the carrier and substrate to an object. When the information carrier is peeled off the object, the substrate remains on the object, thereby separating the substrate and the base material. Accordingly, the signals from the signal-forming portion are no longer transmitted to base portion.

13 Claims, 16 Drawing Sheets (a)

(b)

(c)

(a)

(b)

(c)

(d)

(a)

(b)

(c)

(a)

(b)

(c)

INFORMATION CARRIER, INFORMATION RECORDING MEDIUM, SENSOR, COMMODITY MANAGEMENT METHOD

TECHNICAL FIELD

This invention relates to an information carrier having specific information (information recording medium such as RFID tag, IC label and the like) and a sensor for detecting the state of an object.

BACKGROUND ART

To forward the automation of a distribution, it is important to automatically read the contents of slips stuck to the individual articles by using a machine. For this purpose, so far, barcode labels corresponding to the contents have been stuck to the individual slips.

To read the barcode labels by using a so-called barcode reader, however, a predetermined relationship concerning distance and direction must be established between the two while maintaining high precision, hindering the smooth distribution. Besides, only small amounts of information can be input to the barcode, and the range of managing the distribution is limited to be narrow.

In recent years, therefore, there has been used slip data-incorporating IC labels capable of effecting the reading in a non-contacting manner using an induction field. According to the slip data-incorporating IC labels, the recorded data are read by using the induction field without much limitation due to distance or direction for reading the data, which is very convenient for the management processing.

Besides, the individual data of the object to be managed can be stored in the IC in the IC label. Depending upon the use, the function for storing the individual data can be used as security information for specifying the individual articles. However, when the information of the individual articles is used for the security purpose, it is essential that the information of the individual articles to be managed is in agreement with the information stored in the ICs, and the IC labels that are once used, i.e., once stuck must not be used for other articles that are to be managed. The IC labels used for managing the distribution are usually stuck to the surfaces of packaging boxes and articles in a manner that they can be easily attached and detached without excluding such a probability that the IC labels that are once used, i.e., once stuck can be peeled off the articles and can be fraudulently stuck to other articles, making it difficult to maintain a perfect security.

In this regard, there has been disclosed a technology for preventing the fraud such as peeling of the surface layer of the IC card to stick it to another one, by forming the surface layer of the IC card using a material that develops peeling in the layer with a stress smaller than the breaking strength in the case the surface layer is peeled (see Japanese Laid-Open Patent Publication "JP-A-10-171962").

According to the above technology, however, the surface layer is peeled inside the layer in order to prevent the forgery of the IC card itself, which is not to inhibit the reading of information recorded in the IC that is incorporated. Therefore, the above technology does not make it possible to solve the above problems of the IC label.

The above problem is not specific to the non-contact IC labels (e.g., RFID tag and the sticking type IC card) only which effect the communication relying upon the electromagnetic waves through antennas but also applies to the IC labels, in general, inclusive of the non-communication type IC labels.

Concerning this problem, the applicant considers that it would be desired to provide a sensor that cannot be used again if it is once peeled off the object (object having characteristics in agreement with those of the sensor) to which it had been stuck, so that the sensor cannot be used for the undesired objects, i.e., so that the sensor cannot be used for the objects having characteristics which are not in agreement with the characteristics possessed by the sensor.

The present invention was accomplished in view of the above problems, and its object is to provide an information carrier (e.g., information recording medium like RFID tag and the like) and a sensor which cannot be used again if they are once peeled off the objects to which they had been stuck.

DISCLOSURE OF THE INVENTION

In order to solve the above problem, the present invention deals with an information carrier in which a substrate having a signal-forming portion for forming signals corresponding to a specific information is attached to a base material having a transfer portion for transferring the signals, and the specific information is recognized relying upon the signals transferred from the signal-forming portion through the transfer portion, wherein the surface on the side to where the substrate is attached is a surface to be stuck to an object, and an adhesive layer is formed on the substrate, the adhesive layer having an adhesive force to the object which is grater than an attaching force between the substrate and the base material.

First, the signal-forming portion is the one for forming signals (e.g., electric signals, optical signals, chemical signals or electromagnetic wave signals) corresponding to the specific information, and may be, for example, an information recording circuit that forms electric signals such as a signal of current, voltage or electric field.

The transfer portion is the one for transferring the signals, and may be, for example, a conductor circuit for transferring electric signals, an optical waveguide for transferring optical signals or a fine tube for transferring chemical signals.

The information carrier is stuck to the object in a manner that the surface on the side where the substrate is attached faces the side of the object. Namely, the substrate and the base material to which the substrate is attached are adhered to the object due to the adhesive layer formed on the substrate.

In this state, a person (user) managing the object is allowed to recognize the specific information (e.g., specific information corresponding to the object) relying upon the signals formed by the signal-forming portion on the substrate and transferred through the transfer portion on the base material.

Here, the adhesive force of the adhesive layer to the object (force of the adhesive layer for adhering the object and the substrate together) is greater than the attaching force between the substrate and the base material. Therefore, the substrate is disposed between the object and the base material, is bonded (adhered/attached) both to the object and to the base material, and is adhered more strongly to the object than to the base material.

Therefore, in a case the information carrier is peeled off the object, the substrate remains on the object, and the substrate and the base material are separated away from each other. That is, if the information carrier is once peeled off the object on which it had been adhered, the signal-forming portion on the substrate is separated away from the transfer portion on the base material, and the signals from the signal-forming portion are no longer transmitted.

As described above, once the information carrier is peeled off the object to which it had been stuck, the specific information can no longer be recognized (read out) from the outer side, and is destroyed. As a result, it is made possible to prevent such a fraud that the information carrier used for (stuck to) a given article can also be used for other articles and, thus, the information security of the information carrier can be reliably maintained.

In order to solve the above problem, further, the present invention deals with an information carrier in which a substrate having a signal-forming portion for forming signals corresponding to the specific information is attached to a base material having a transfer portion for transferring the signals, and the specific information is recognized relying upon the signals transferred from the signal-forming portion through the transfer portion, wherein the surface on the side of the base material is a surface to be stuck to an object, and an adhesive layer is formed on the surface of the base material on the side opposite to the surface thereof to where the substrate is attached, the adhesive layer having an adhesive force to the object which is grater than an attaching force between the base material and the substrate.

The information carrier is stuck to the object in a manner that the object is faced by the surface on the side of the base material, which is the surface on the side opposite to the surface of the base material to where the substrate is attached. That is, the base material and the substrate attached to the base material are adhered to the object due to the adhesive layer formed on the base material.

In this state, the a person (user) managing the object is allowed to recognize the specific information (e.g., specific information corresponding to the object) relying upon the signals formed by the signal-forming portion on the substrate and transferred through the transfer portion on the base material.

Here, the adhesive force of the adhesive layer to the object (force of the adhesive layer for adhering the object and the base material together) is greater than the attaching force between the base material and the substrate. Therefore, the substrate is disposed between the object and the base material, is bonded (adhered/attached) both to the object and to the substrate, and is adhered more strongly to the object than to the substrate.

Therefore, in a case the information carrier is peeled off the object, the base material remains on the object, and the base material and the substrate are separated away from each other. That is, if the information carrier is once peeled off the object on which it had been adhered, the signal-forming portion on the substrate is separated away from the transfer portion on the base material, and the signals from the signal-forming portion are no longer transferred.

As described above, once the information carrier is peeled off the object to which it had been stuck, the specific information can no longer be recognized (read out) from the outer side, and is destroyed. As a result, it is made possible to prevent such a fraud that the information carrier used for (stuck to) a given article can also be used for other articles and, thus, the information security of the information carrier can be reliably maintained.

In order to solve the above problem, further, the present invention deals with an information carrier in which a substrate having an information recording circuit is attached to a base material having a conductor portion in a manner that the conductor portion and the information recording circuit are electrically connected together, and information in the information recording circuit is read out through the conductor portion, wherein the surface on the side to where the substrate is attached is a surface to be stuck to an object, and an adhesive layer is formed on the substrate, the adhesive layer having an adhesive force to the object which is greater than an attaching force between the substrate and the base material.

The information carrier is stuck to the object in a manner that the object is faced to the surface of the side to where the substrate is attached. Namely, the substrate and the base material to which the substrate is attached are adhered to the object due to the adhesive layer formed on the substrate.

In this state, a person (user) managing the object is allowed to read the information (e.g., management information of the object) from the information recording circuit of the substrate through the conductor portion of the base material.

Here, the adhesive force of the adhesive layer to the object is greater than the attaching force between the substrate and the base material. Therefore, the substrate is disposed between the object and the base material, is bonded (adhered/attached) both to the object and to the base material, and is adhered more strongly to the object than to the base material.

Therefore, in a case the information carrier is peeled off the object, the substrate remains on the object, and the substrate and the base material are separated away from each other. That is, if the information carrier is once peeled off the object on which it had been adhered, the conductor portion on the base material is reliably separated away from the information recording circuit on the substrate and is destroyed.

As described above, once the information carrier is peeled off the object to which it had been stuck, the specific information can no longer be recognized (read out) from the outer side, and its function is lost. As a result, it is made possible to prevent such a fraud that the information carrier used for (stuck to) a given article can also be used for other articles and, thus, the information security of the information carrier can be reliably maintained.

In the information carrier of the invention, further, it is desired that the bonding force in the adhesive layer in the direction of a plane (strength of the adhesive layer in the direction of a plane) is weaker than the adhesive force of the adhesive layer to the object (adhesive force of the adhesive layer in the direction of thickness).

When the information carrier is peeled off the object and the substrate and the base material are separated away from each other, the adhesive layer, too, is divided into a portion that remains on the object side and a portion adhered to the base material side.

Here, according to the above constitution, the bonding force in the adhesive layer in the direction of a plane (strength of the adhesive layer in the direction of a plane) is weaker than the adhesive force of the adhesive layer to the object and, hence, the adhesive layer is smoothly divided (divided in the direction of a plane) in conjunction with the separation of the substrate and the base material. When the information carrier is peeled off the object, therefore, the conductor portion (base material side) is more reliably cut from the information recording circuit (substrate), and the information security of the information carrier is maintained more reliably.

In the information carrier of the invention, it is desired that a reinforcing member is provided for at least a portion corresponding to the substrate on the surface of the side opposite to the surface that is to be stuck. It is desired that the reinforcing member is made of a hard material that does not easily bend in the direction of a thickness.

According to the above constitution, the base material positioned between the reinforcing member and the substrate is reinforced by the reinforcing member so as not to be bent. This prevents such a fraud that a tool is inserted between the substrate and the object (inserted in the adhesive layer) to gradually peel the information carrier (without destroying it)

off the object while bending the base material. As a result, the information security of the information carrier can be maintained more reliably.

The information carrier of the present invention may be so constituted that the conductor portion is connected to an antenna provided on the base material (surface of the base material on the side to where the substrate is attached).

The above constitution is the one in which the information recorded in the information recording circuit is sent as electric signals to the antenna through the conductor portion, and is transmitted to the external side. According to this constitution, the information carrier can be utilized as an RFID tag (wireless IC tag, IC tag) or as a non-contact IC card featuring a high information security.

The information carrier of the invention may be so constituted that a display portion connected to the conductor portion is provided on the surface of the base material on the side opposite to the surface thereof to where the substrate is attached (opposite to the surface to where the substrate is attached).

The above constitution is the one in which the information recorded in the information recording circuit are sent as electric signals to the display portion through the conductor portion and is displayed on the display portion. According to this constitution, the information carrier can be utilized as an IC label with a display portion featuring a high information security.

In order to solve the above problem, further, the present invention deals with a sensor comprising a substrate having a signal-forming portion for detecting the state of an object and for forming a signal corresponding to the state, and a base material to which the substrate is attached and having a transfer portion for transferring the signal, wherein an adhesive layer is formed on the surface of the substrate on the side opposite to the surface thereof that is attached to the base material or on the surface of the base material on the side opposite to the surface thereof that is attached to the substrate, the adhesive layer having an adhesive force to the object that is greater than the attaching force between the substrate and the base material.

According to the above constitution, the surface of the substrate on the side opposite to the surface thereof that is attached to the base material is stuck to the object, or the surface of the base material on the side opposite to the surface thereof that is attached to the substrate is stuck to the object.

The signal-forming portion provided on the substrate detects the state of the object and forms a signal thereof. The signal from the signal-forming portion is transferred through the transfer portion of the base material, and the state of the object is recognized by the external unit. Here, the sensor of the invention is so set as to be in agreement with the properties of the object.

The adhering force of the adhesive layer to the object is stronger than the attaching force between the substrate and the base material. Therefore, in a case the sensor is peeled off the object, either the substrate or the base material (on which the adhesive layer has been formed) remains on the object, and the substrate and the base material are separated away from each other. That is, if the sensor is once peeled off the object to which it had been adhered, the signal-forming portion of the substrate is reliably cut from the transfer portion of the substrate, and is destroyed.

As described above, the sensor cannot be utilized again if it is once peeled off the object (object having properties in agreement with those of the sensor) to which it had been stuck, so that it cannot be utilized for the undesired objects, i.e., objects having properties that are not in agreement with the properties possessed by the sensor.

In order to solve the above problem, further, the present invention deals with a method of managing articles by sticking, onto an article to be managed, an information carrier which comprises a substrate having a signal-forming portion for forming a signal depending upon a specific information and a base material having a transfer portion for transferring the signal, the substrate being attached to the base material, in a manner that the surface thereof on the side to where the substrate has been attached is the surface that is to be stuck, recognizing the specific information relying upon the signal transferred from the signal-forming portion through the transfer portion and, in a case the information carrier is peeled off the article to be managed, separating the substrate and the base material from each other while permitting the substrate only to remain on the article to be managed, so that no signal can be transferred through the transfer portion.

According to the above method of managing the articles, if the information carrier stuck to the article to be managed is peeled off, the signal-forming portion on the substrate is separated away from the transfer portion on the base material, and no signal is transferred from the signal-forming portion. Therefore, the information carrier is destroyed and loses its function. Namely, it is made possible to reliably prevent such a fraud that the information carrier used for (stuck to) a given article is used for other articles. As a result, the articles can be highly reliably managed while maintaining information security.

In order to solve the above problem, further, the present invention deals with an information recording medium comprising a base material on which an antenna coil is arranged, and an electronic part substrate mounting an electronic part that constitutes an information recording circuit and is attached to the base material while electrically connecting the information recording circuit to the antenna coil, wherein the surface of the information recording medium on the side to where the electronic part substrate is attached is used as a surface for sticking the information recording medium to an object, and an adhesive layer is formed on at least the surface of the electronic part substrate that is to be stuck.

According to a preferred embodiment of the invention, the adhesive force of the adhesive layer can be set to be stronger than the strength of attachment between the electronic part substrate and the base material.

In this invention, further, the bonding force in the adhesive layer in the direction of a plane can be set to be weaker than the adhesive force of the adhesive layer in the direction of thickness.

In this invention, further, a hard member that does not bend in the direction of thickness can be adhered onto a portion at least corresponding to the electronic part substrate on the surface of the information recording medium on the side opposite to the surface that is to be stuck.

Further, according to the method of managing articles of the invention, management of the article to be managed is executed by sticking the information recording medium onto the article to be managed by using the adhesive layer and, in a case the information recording medium is peeled off the article to be managed, the attachment between the base material of the information recording medium and the electronic part substrate is separated and is destroyed.

In this invention, if the information recording medium is peeled off the object to be managed to which the information recording medium had been stuck, the electronic part substrate remains adhered onto the object to be managed but is separated away from the base material and is destroyed due to the adhesive layer on the electronic part substrate provided on the base material on the side of the object to be managed.

Further, the information recording medium can be simply and easily constituted in a manner that the information recorded in the information recording circuit cannot be read out if it is peeled off the object to be managed.

The electronic part substrate that will be destroyed if it is separated away from the base material, is directly adhered to the object to be managed via the adhesive layer and can, hence, be reliably separated and destroyed if it is separated irrespective of the conditions for peeling the information recording medium off.

No particular production step is necessary, and there is no need of introducing any particular production facility.

Even if any protection layer for protecting the information recording medium is provided on the side opposite to the surface to be stuck of the information recording medium, the constitution for destroying the electronic part substrate when it is separated is not at all affected, and there is reliably obtained an effect of destruction when separated.

Upon setting the adhesive force of the adhesive layer to be stronger than the strength of attachment between the electronic part substrate and the base material, the information recording medium can be positively destroyed when it is peeled, reliably making it further difficult to read the information.

The bonding force of the adhesive layer in the direction of a plane is set to be weaker than the adhesive force of the adhesive layer in the direction of thickness. Therefore, even when the adhesive layer is formed on the surface to be stuck of the base material other than the surface to be stuck of the electronic part substrate, the force for peeling the base material acts as a force for peeling the electronic part substrate through the bonding force of the adhesive layer in the direction of a plane, preventing the electronic part substrate from peeling.

Namely, the adhesive layer breaks in the direction of a plane against the adhesive force in the direction of thickness which is for adhering the electronic part substrate to the object to be managed, whereby the electronic part substrate remains on the object to be managed and is reliably separated and destroyed.

A hard member that does not bend in the direction of thickness is adhered onto the surface of the base material on the side opposite to the surface thereof to be stuck at a portion at least corresponding to the electronic part substrate. In the case the information recording medium is being peeled off, therefore, the base material does not bent, making it difficult to peel off the electronic part substrate that will be easily broken if separated despite a peeling attempt is carefully made by using tools.

Further, the information recording medium that does not bend forbids any attempt to insert tools in the junction surface between the electronic part substrate and the article to be managed.

There is further exhibited an effect of protecting the information recording medium itself from the external shocks.

As described above, in the case the information carrier of the invention is peeled off the object (to be managed), the substrate having the signal-forming portion is separated away from the base material having the transfer portion, and no signal is transferred from the signal-forming portion. Thus, if once peeled off the object to which it had been adhered, the information carrier of the invention is destroyed and loses its function. Therefore, this prevents such a fraud that the information carrier used for (stuck to) a given article is used for other articles and, thus, the information security of the information carrier is reliably maintained.

Other objects, features and excellent points of the invention will be more fully understood from the following description. Further, the advantages of the invention will become apparent from the following description with reference to the accompanying drawings.

DESCRIPTION OF THE DRAWINGS

FIG. 1 is a plan view illustrating the constitution of an RFIC label according to the invention.

FIG. 2 is a sectional view illustrating the constitution of the RFIC label 1 of the invention before it is stuck (along A-A and B-B in FIG. 1).

FIG. 3 is a sectional view illustrating the constitution of the RFIC label 1 of the invention after it is stuck but before it is peeled off (along A-A and B-B in FIG. 1).

FIG. 4 is a sectional view illustrating the constitution of the RFIC label 1 of the invention after it is peeled off (along A-A and B-B in FIG. 1).

FIG. 5(a) to FIG. 5(c) are views of steps for forming a resin base material film 2 used for the RFIC label 1 of the invention.

FIG. 6(a) to FIG. 6(d) are views of steps for forming an electronic part module E used for the RFIC label 1 of the invention.

FIG. 7(a) to FIG. 7(c) are views of steps for mounting the electronic part module E on an antenna coil 3 of the resin base material film 2 in producing the RFIC label 1 of the invention.

FIG. 8(a) to FIG. 8(c) are views of steps of an embodiment for mounting another electronic part module E on the antenna coil 3 of the resin base material film 2.

FIG. 9 is a view illustrating the constitution of when the RFIC label 1 of the invention is provided with an overcoating layer 10.

FIG. 10(a) is a plan view illustrating the constitution of an RFID tag according to an embodiment 2 of the invention, and FIG. 10(b) is a sectional view thereof along the line C-C' in FIG. 10(a).

FIG. 11(a) and FIG. 11(b) are diagrams of steps illustrating a method of using the RFID tag shown in FIG. 10(a).

FIG. 12(a) is a top view illustrating the constitution of a (non-communication display type) IC label according to a further embodiment of the invention, FIG. 12(b) is a front view of the IC label shown in FIG. 12(a), and FIG. 12(c) is a side view of the RFID tag shown in FIG. 12(a).

FIG. 13(a) and FIG. 13(b) are views illustrating a method of using the IC label shown in FIG. 12(a).

FIG. 14 is a sectional view illustrating the constitution of an IC label (optical IC label) according to a still further embodiment of the invention.

FIG. 15(a) and FIG. 15(b) are views of steps illustrating a method of using the IC label shown in FIG. 14.

FIG. 16 is a sectional view illustrating the constitution of a sensor according to a yet further embodiment of the invention.

BEST MODE FOR CARRYING OUT THE INVENTION

Embodiment 1

An embodiment of the invention will now be described with reference to FIGS. 1 to 9.

Figure 1:
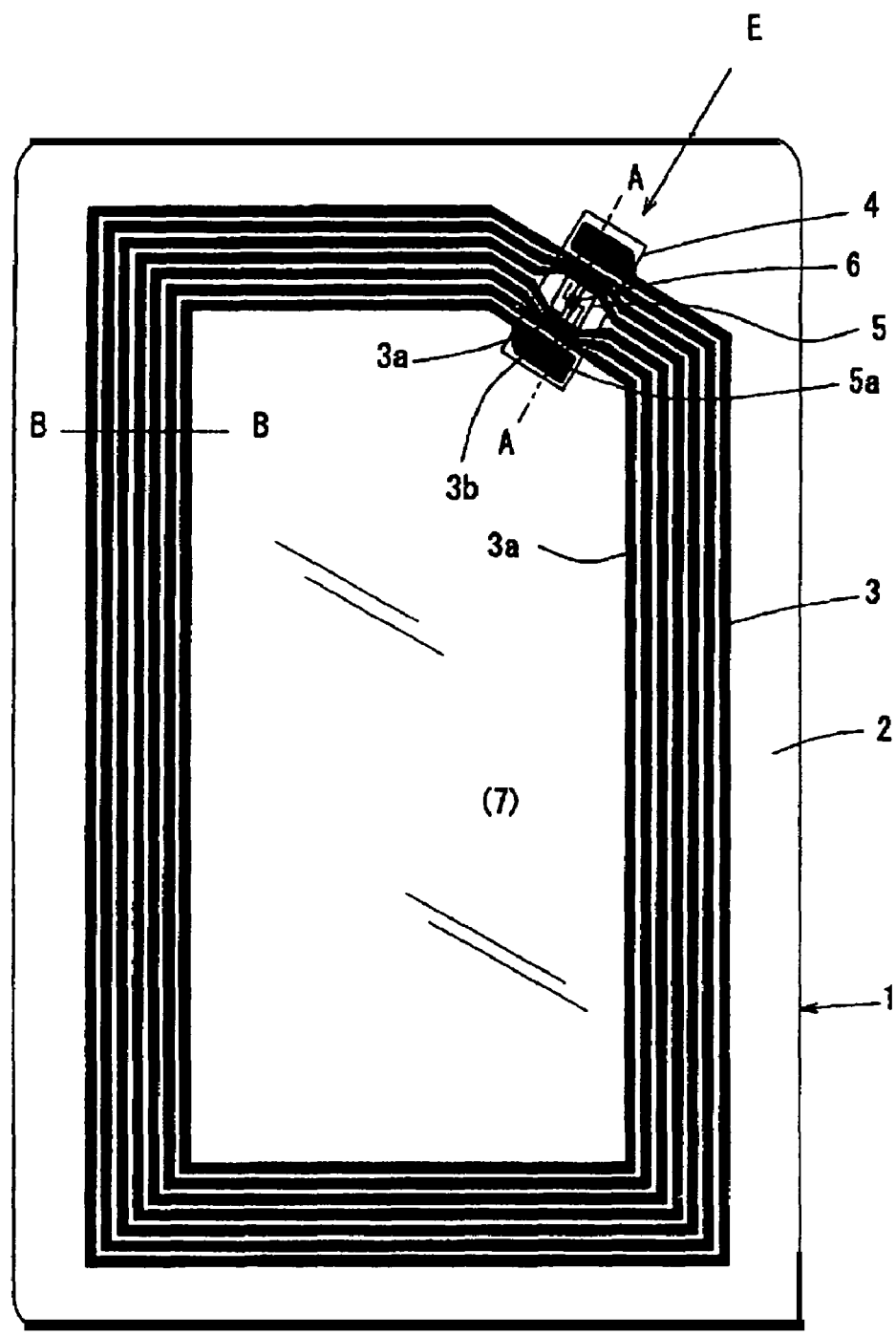
[FIG. 1]

FIG. 1 is a plan view of the RFID tag 1 which is an information recording medium constituted according to the present invention.

Here, the RFID tag (also called wireless IC tag or IC tag) is a very small wireless IC chip utilized for identifying an object. The RFID tag carries information such as its own identification code, and is capable of transmitting and receiving information to and from a management system (reader) through electromagnetic waves.

As shown, the RFID tag 1 (information carrier/information recording medium) of the embodiment 1 includes a resin base material film 2 (base material), an antenna coil 3 (antenna/antenna coil) which is a spiral conductor pattern, an electronic part module E (substrate) and an adhesive layer 7.

The antenna coil 3 is formed like a track on one surface (surface to where the RFID tag 1 is stuck) of the resin substrate film 2 to circle along nearly the outer periphery of the resin base material film 2, and includes a coil portion 3a and an antenna coil attaching portion 3b (transfer portion/conductor portion). The electronic part module E is of a constitution in which an IC chip 6 (signal-forming portion/information recording circuit) is mounted on a substrate circuit 5, and is provided at a corner portion of the track-like antenna coil 3 on the resin base material film 2. The substrate circuit 5 of the electronic part module E is electrically connected to the antenna coil 3 through the antenna coil attaching portion 3b (transfer portion/conductor portion), and is attached to the resin base material film 2.

If described more concretely, the RFID tag 1 as a whole is constituted by the resin base material film 2. In the embodiment 1, the RFID tag 1 is made of a PET (polyethylene terephthalate) film of a thickness of 25 µm in the shape of a card of a commuter's ticket size. The portion of the resin base material film 2 is widely formed on the surface of the RFID tag 1 and serves as a drawing portion in the case the RFID tag 1 is peeled off the object to be managed for a fraudulent purpose.

The antenna coil 3 (coil) of copper of a thickness of 10 µm is formed on the resin base material film 2 on the side of the article to be managed. The antenna coil 3 can be formed by etching as will be described later. In this case, the etching resist is constituted by a material having insulating property. Therefore, the substrate circuit 5 that will be described later can be arranged being overlapped thereon without any treatment for insulation owing to an etching resist layer 8 (FIG. 2) of the antenna coil 3 remaining on the side of the article to be managed.

An induction field from an RF label reader is received by the antenna coil 3 to obtain an electromotive force, and the information recorded in the IC chip 6 and is specific to the IC chip or the information specific to the object to be managed, is transmitted as an electric signal from the antenna coil 3.

The antenna coil 3 is constituted by a coil portion 3a circling nearly along the outer periphery of the resin base material film 2 and an antenna coil attaching portion 3b (conductor portion) to be attached to the electronic part module E (electronic part substrate) that will be described later. Namely, the antenna coil attaching portion 3b to be attached to the electronic part module E is a portion that is electrically connected to the substrate circuit 5 of the electronic part module E. The antenna coil attaching portion 3b is formed to be wider than the coil portion 3a for attaching the resin base material film 2 which is a resin material to the resin substrate 4 that constitutes the electronic part module E that will be described later, and for maintaining an area necessary for electrically connecting the antenna coil 3 to the substrate circuit 5.

The electronic part module E includes the resin substrate 4, the substrate circuit 5 and the IC chip 6 electrically connected thereto, and is produced separately from the step of producing the resin base material film 2 as will be described later.

The resin substrate 4 is formed by the PET film of a thickness of 25 µm maintaining an area smaller than the resin base material film 2, so that the substrate circuit 5 and the IC chip 6 can be arranged thereon.

An aluminum foil of a thickness of 20 µm is adhered onto one surface of the resin substrate 4, or onto the side of the resin base material film 2 that is to be attached in the case of this embodiment. As will be described later, the substrate circuit 5 is constituted by a press work, and the IC chip 6 and the antenna coil 3 are electrically connected together through the substrate circuit attaching portion 5a corresponding to the attaching portion 3b.

The electronic part module E is arranged on the resin base material film 2 on the side of the object to be managed so as to remain on the object to be managed being separated and destroyed in the case the RFID tag 1 is fraudulently peeled off the object to be managed.

The substrate circuit attaching portion 5a of the substrate circuit 5 and the antenna coil attaching portion 3b of the antenna coil 3 are attached together by an ultrasonic junction method that will be described later, exhibiting a junction strength large enough to withstand the ordinary use of the RFID tag 1 but are weakly joined so as to be separated and destroyed in the case the RFID tag 1 is peeled off for fraudulent purpose.

The IC chip 6 is constituting an information recording circuit for recording information specific to the object to be managed or information specific to the RFID tag 1, and transmits information recorded therein upon receiving induced electromotive force from the antenna coil 3.

The adhesive layer 7 is formed on the whole RFID tag 1 on the side of the object to be managed, i.e., on the side of the resin base material film 2 to where the electronic part module E is attached, for attaching the RFID tag 1 to the object to be managed.

The adhesive layer may be formed at least on the resin substrate 4 on the side of the object to be managed so that the electronic part module E can be adhered to the object to be managed. On the side of the object to be managed other than the electronic part module E, an adhesive layer 7 is formed for attaching the RFID tag 1 itself to the object to be managed.

The adhesive layer 7 can be formed by applying a hot-melting adhesive agent by using a roll coater or by laminating a double-sided tape without a base material.

Owing to the above constitution of the adhesive layer 7, the bonding force in the adhesive layer 7 in the direction of a plane can be set to be weaker than the adhesive force in the direction of thickness which is the object of the adhesive layer 7. Therefore, the adhesive layer 7 is broken in the direction of a plane against the adhesive force thereof in the direction of thickness for adhering the electronic part module E to the object that is to be managed. Therefore, the electronic part module E remains on the object to be managed and is reliably separated and destroyed.

Figure 2:
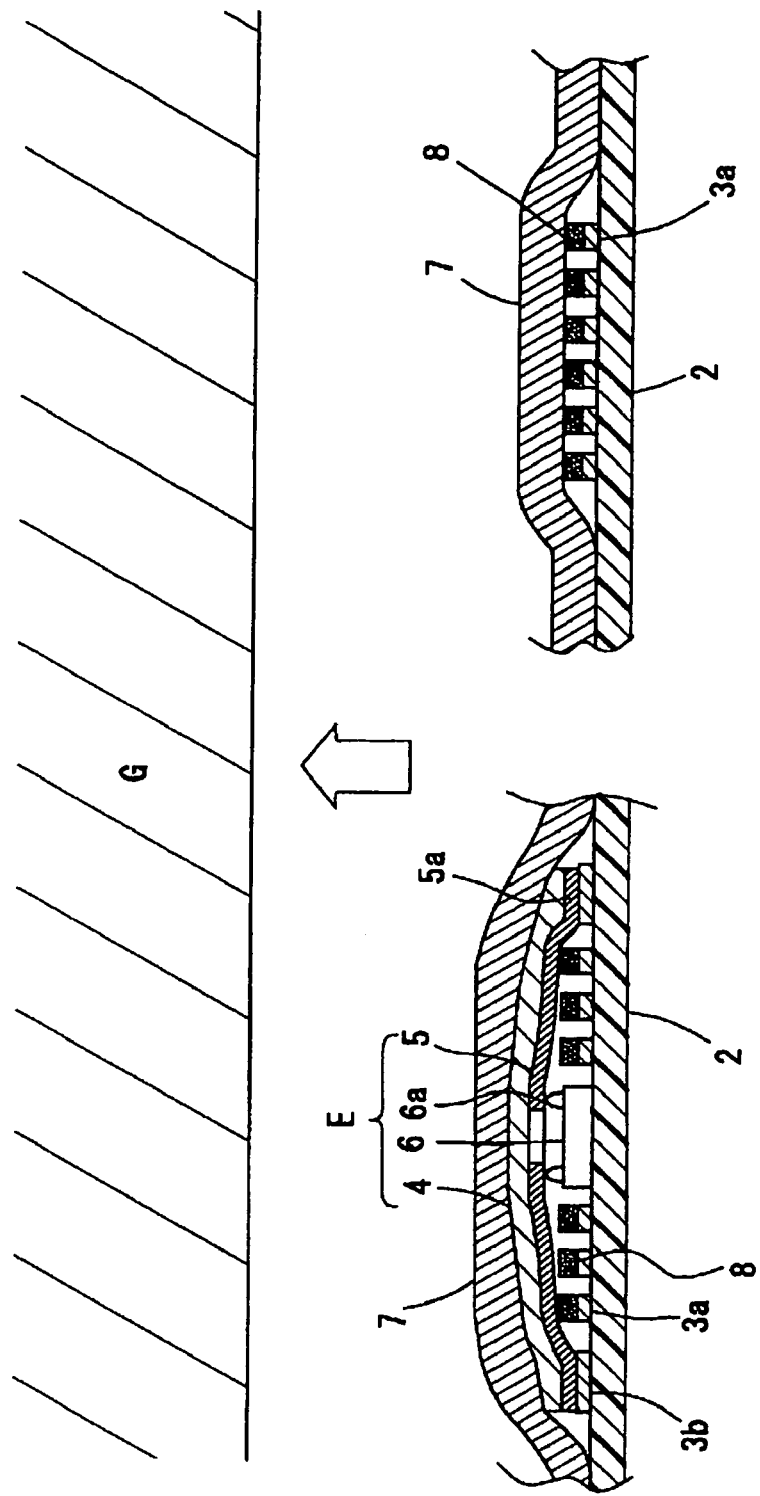
[FIG. 2]
Figure 3:
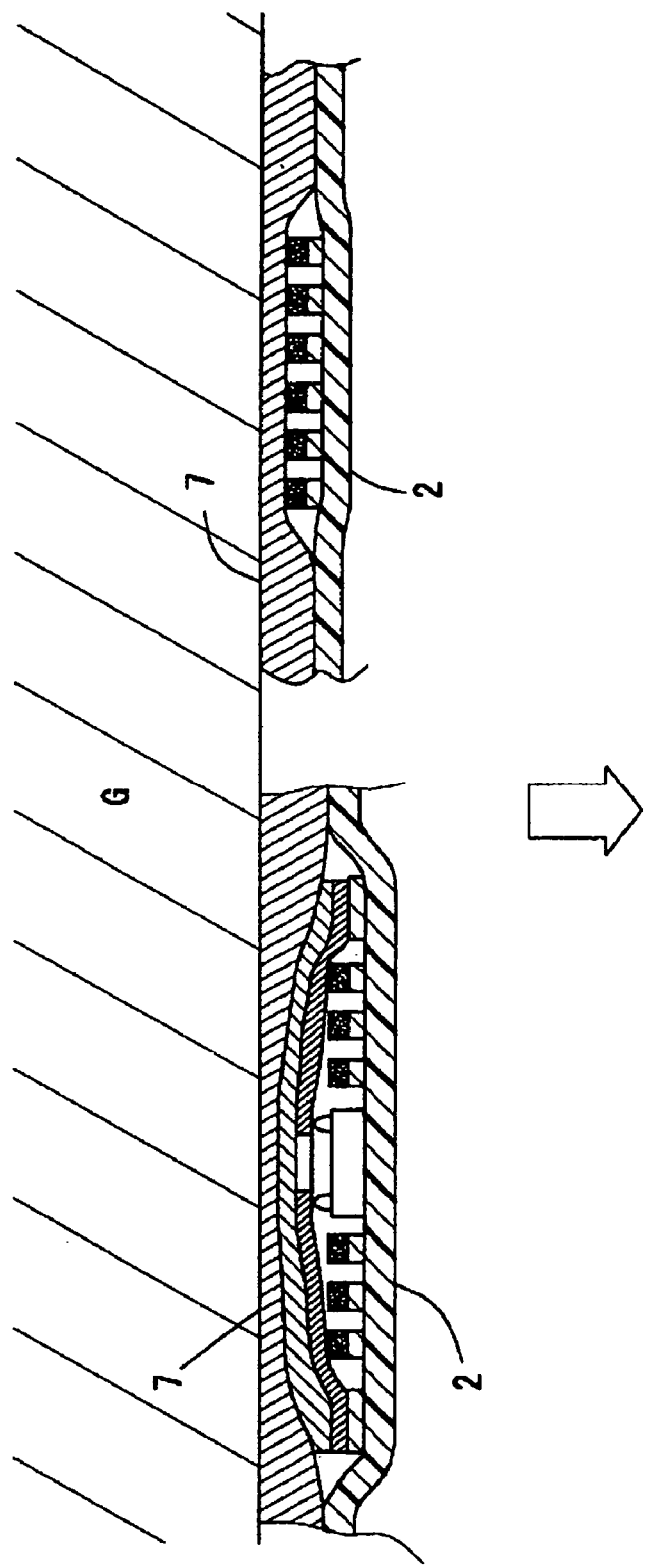
[FIG. 3]
Figure 4:
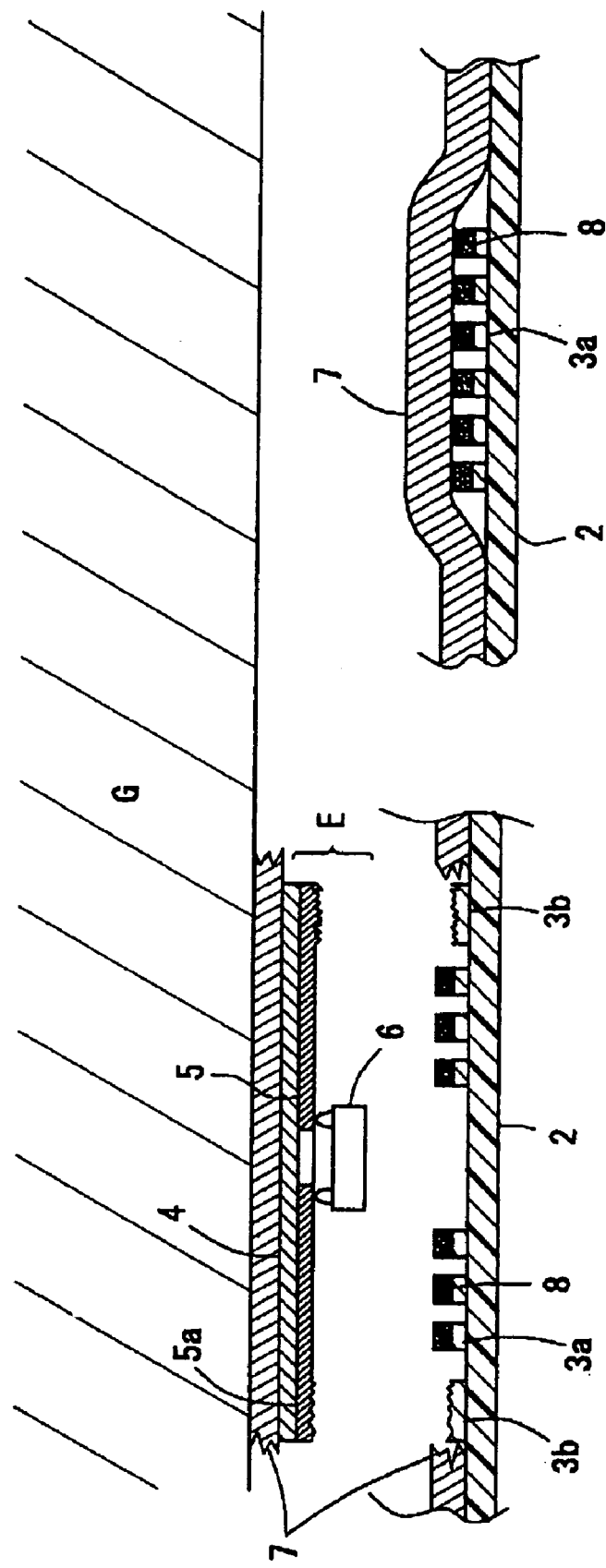
[FIG. 4]

Next, for easy explanation of the structure in cross section, the sectional views of FIG. 1 along the line A-A and the line B-B are illustrated in FIG. 2 which shows the constitution before being stuck, in FIG. 3 which shows the constitution after having been stuck and in FIG. 4 which shows the constitution when peeled off.

First, FIG. 2 illustrates the constitution of just before the RFID tag 1 of the invention is stuck to the object to be managed. The RFID tag 1 is stuck to the object G to be managed. Before being used, a peeling paper (not shown) is stuck to the surface of the adhesive layer 7 to protect it so that the adhesive layer 7 will not be undesirably adhered to an undesired object. The peeling paper is so constituted as can be easily peeled. FIG. 2 illustrates a state where the peeling paper has been peeled off.

Referring to the sectional view along the line A-A illustrating a major portion of the invention, there are provided, from the side of the object G to be managed, the electronic part module E including the adhesive layer 7, the resin substrate 4, the substrate circuit 5 and the IC chip 6; the resin base material film 2 electrically connected to the electronic part module E through the substrate circuit attaching portion 5a and the antenna coil attaching portion 3b, and is attached thereto; the antenna coil 3 on the resin base material film 2 on the side of the object G to be managed, and the etching resist layer 8 further on the side of the object G to be managed.

Here, the substrate circuit attaching portion 5a and the antenna coil attaching portion 3b are such that the aluminum atoms in the substrate circuit attaching portion 5a diffuse into copper of the antenna coil attaching portion 3b to accomplish electric connection therebetween, and that the corresponding portions of the resin substrate 4 and of the resin base material film 2 thereof are attached together to exhibit a junction strength which sufficiently withstands the ordinary use of the RFID tag 1.

The etching resist layer 8 is formed on the coil portion 3a of the antenna coil 3 on the side of the object G to be managed. This is for forming the coil portion 3a and the antenna coil attaching portion 3b as will be described later, and is made of a material having insulating property and can, hence, be used as an insulating layer for insulating the substrate circuit 5 and the coil portion 3a.

Therefore, the circuit can be easily and suitably arranged without providing any particular insulating layer for the substrate circuit 5.

The sectional view along the line B-B illustrates a portion of the antenna coil 3 without the electronic part module E.

There are arranged the adhesive layer 7, the etching resist layer 8, the antenna coil 3 and the resin base material film 2 in order mentioned from the side of the object G to be managed. In this portion, there is no antenna coil attaching portion 3b, but the coil portion 3a only is arranged.

Like the above, the etching resist layer 8 is for forming the antenna coil 3. Though it does not work as the insulating layer unlike the one at the sectional portion along the line A-A, the etching resist layer 8 is left to stand since it is not of a nature to hinder the RFID tag 1.

This is stuck to the object G to be managed from a direction of a thick arrow.

FIG. 3 illustrates the constitution of a state where the RFID tag 1 has been stuck to the object G to be managed.

Here, the resin base material film 2 and the adhesive layer 7 are constituted by materials having flexibility so as to be deformed, to be dented or protruded to meet the surface shape of the object G to be managed and the part such as the electronic part module held between the resin base material film 2 and the adhesive layer 7.

Therefore, the RFID tag 1 can be more strongly adhered to the object G to be managed, the processing for managing the object can be reliably accomplished to reliably achieve various effects owing to the specific constitution of the invention, i.e., the effect for separating and destroying the electronic part module E by permitting it to remain being adhered on the object G to be managed while separating it from the base material.

Here, the RFID tag 1 is peeled off in the direction of a thick arrow. Here, of the RFID tag 1, the resin base material film 2 widely covering the surface is used as a drawing portion.

FIG. 4 illustrates a state where the electronic part module E is separated away from the RFID tag 1 and is destroyed as the RFID tag 1 is peeled off the object G to be managed to which it had once been attached, i.e., illustrates the constitution of a state where the electronic part module E is destroyed by being separated away from the resin base material film 2 that is forming the main body of the RFID tag 1.

The electronic part module E is remaining on the surface of the object G to be managed via the adhesive layer 7 of a corresponding portion. The adhesive layer 7 is peeled off the surface of the object G to be managed as the resin base material film 2 which is the drawing portion is pulled and peeled. Concerning the portion corresponding to the electronic part module E, stress of pulling concentrates at a position where the substrate circuit attaching portion 5a and the antenna coil attaching portion 3b are attached together.

The junction strength at this portion is large enough for the RFID tag 1 to work, but is not so strong as to peel the adhesive layer 7 off the object G to be managed or as to peel the electronic part module E off the adhesive layer 7. Besides, the above attached portion is sufficiently narrower than the area where the adhesive layer 7 is adhered. Therefore, the tensile stress concentrates on the portion where the substrate circuit attaching portion 5a and the antenna coil attaching portion 3b are attached together, whereby the attachment and the function are easily destroyed, and the electronic part module E is separated away from the RFID tag 1 and is destroyed.

Here, the adhesive force of the adhesive layer 7 in the direction of thickness has been set to be stronger than the bonding force thereof in the direction of a plane. Namely, the force adhering the electronic part module E to the object G to be managed is stronger than the force of peeling the electronic part module E off the object G to be managed via the bonding in the direction of a plane of the adhesive layer 7 on the resin base material film 2 that is peeled off. Therefore, the adhesive layer 7 easily breaks at the boundary of the surface for sticking the electronic part module E and permits the electronic part module E to remain on the object G to be managed.

On the other hand, the resin base material film 2 of the RFID tag 1 peeled off the object G to be managed has been constituted by a material (e.g., PET, PBT or polyimide film) having a strong bonding force in the direction of a plane, and can be peeled off continuously by one time of peeling deed.

The adhesive force of the adhesive layer 7 is such that the adhesive force of the adhesive layer 7 to the resin base material film 2 or to the etching resist layer 8 is greater than the adhesive force of the adhesive layer 7 to the object G to be managed. In the case the RFID tag 1 is peeled off, therefore, the adhesive layer 7, too, can be peeled off continuously.

Therefore, the adhesive agent of the adhesive layer 7 is not left on the surface of the object G to be managed, and the processing for managing the object G to be managed can be completed without deteriorating the commercial value of the object G to be managed.

Concerning the electronic part module E remaining on the surface of the object G to be managed, the resin substrate 4 is constituted by a material (e.g., PET, PBT or polyimide film) having a strong bonding force in the direction of a plane like the resin base material film 2. Therefore, the adhesive force of the adhesive layer 7 to the electronic part module E or to the resin substrate 4 is greater than the adhesive force of the adhesive layer 7 to the object G to be managed. If the electronic part module E is peeled off, therefore, everything can be peeled off and, besides, the adhesive layer 7, too, can be easily peeled continuously.

Thus, the processing for managing the object G to be managed can be completed without deteriorating the commercial value of the object G to be managed.

Figure 8:
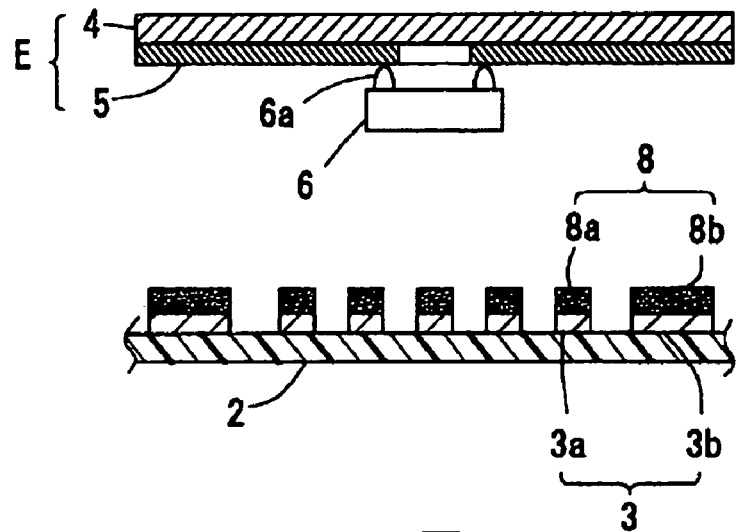
[FIG. 8]
Figure 8:
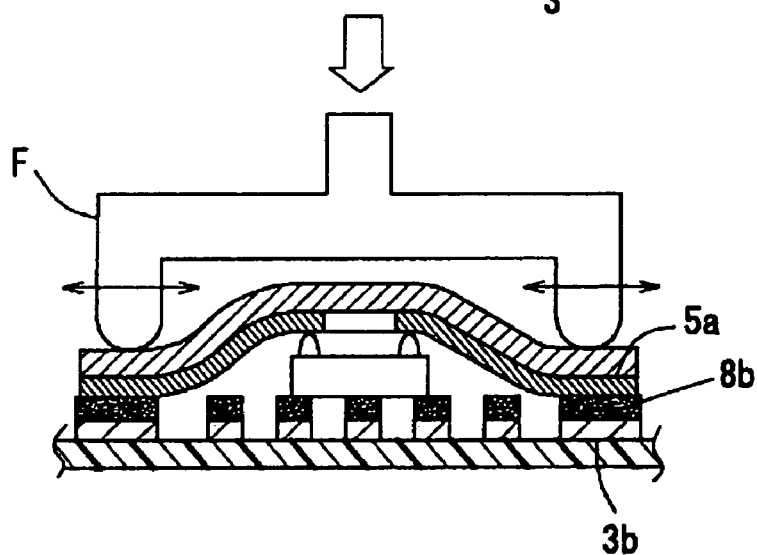
Figure 8:
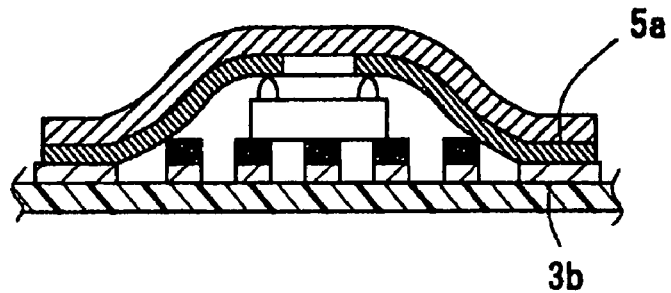

Next, a method of producing the RFID tag 1 of the present invention will be described with reference to FIG. 5(*a*) to FIG. 5(*c*) through up to FIG. 8(*a*) to 8(*c*).

Figure 5:
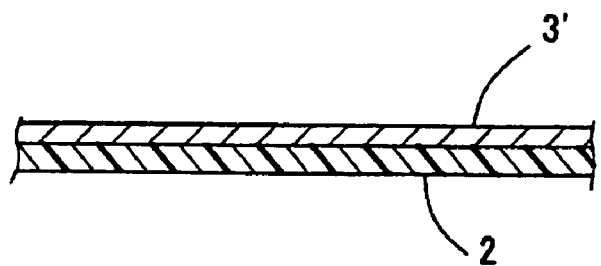
[FIG. 5]
Figure 5:
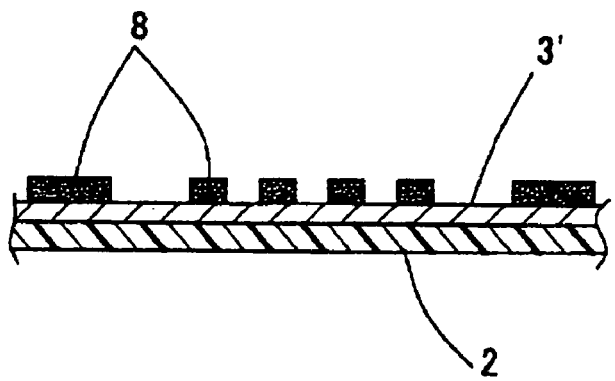
Figure 5:
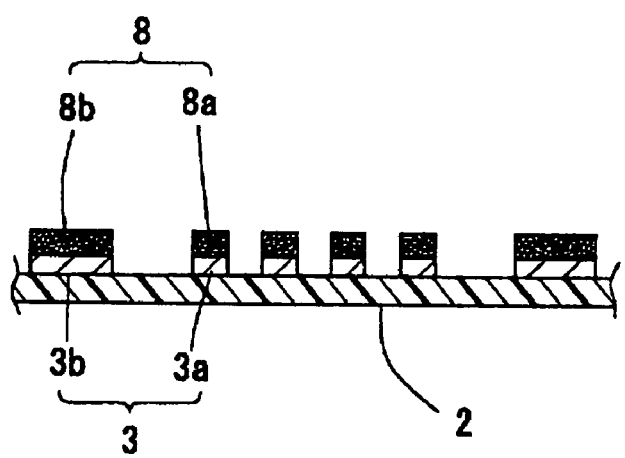

FIG. 5(*a*) to FIG. 5(*c*) illustrate the steps of forming the resin base material film 2, the antenna coil 3 arranged thereon and the etching resist layer 8.

At the step of lamination, first, a Cu-PET laminated base material is prepared. As an example, a Cu layer 3' of a thickness of 10 μm is overlapped on one surface of the resin base material film 2 having a thickness of 25 μm via an urethane adhesive (not shown), and is heat-laminated, i.e., heat-press adhered under the conditions of 150° C. and a pressure of 5 kg/cm$^2$ to laminate and adhere them together. A polyimide film or the like film may be used as the resin base material film 2.

Thus, there is completed a Cu-PET laminated material in which the Cu foil 3' is adhered on the surface of the resin base material film 2 (FIG. 5(*a*)).

Next, at the step of resist printing, the etching resist layer 8 of a coil shape is formed on the surface of the Cu foil 3' of the laminated material. Namely, the etching resist layer 8 of the shape of a coil is formed on the surface of the Cu foil 3' of the laminated material. That is, an insulating etching resist ink is printed on the Cu foil in the shape of the coil having a number of turns, line width, pitch and inner and outer cirumferences for obtaining an L-value and a Q-value which are the characteristics required for the coil relying upon, for example, an offset printing method (FIG. 5(*b*)).

The resist ink used here is of the type that cures with heating or active energy ray. The active energy ray may be an ultraviolet ray or an electron ray. When the ultraviolet ray is used, a photopolymerizing agent is used being introduced into the resist ink.

Next, at the step of etching, the Cu foil portions which are exposed through the etching resist layer 8 formed by the above step, i.e., on which the etching resist layer 8 has not been printed, are removed by the known etching to form the antenna coil 3.

In conducting the etching treatment, FeCl$_2$ (120 g/l) is used as an etching solution under a condition of 50° C. to remove Cu (FIG. 5(*c*)).

Upon using the technology of Japanese Laid-Open Patent Publication (JP-A-11-333409) that will be described later, the etching resist 8 between the connection terminals is removed by mechanical friction due to ultrasonic waves, and there is no need of removing the insulating etching resist 8. Usually, the electronic module E cannot be mounted on the antenna coil 3 unless the insulating etching resist formed by the step shown in FIG. 5(*b*) is removed. In this embodiment, however, the etching resist between the connection terminals can be removed by mechanical friction based on ultrasonic waves. Therefore, there is no need of removing the insulating resist. Namely, in this embodiment, the step of peeling the etching resist can be omitted and, besides, the etching resist can be used as an insulating layer for protecting the surface of the Cu circuit pattern (antenna coil 3).

Through the above steps, there are formed the antenna coil 3 having the coil portion 3*a* and the antenna coil attaching portion 3*b* on the resin base material film 2, and there is obtained the constitution in which the surfaces thereof are covered with the etching resist layer 8 inclusive of the coil portion resist layer 8*a* and the attaching portion resist layer 8*b*.

Figure 6:
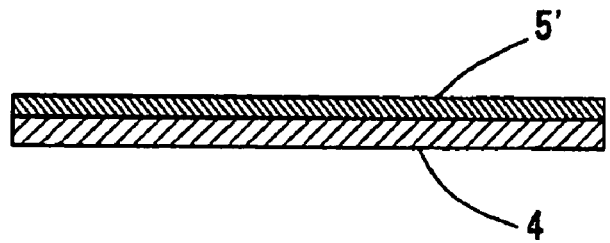
[FIG. 6]
Figure 6:
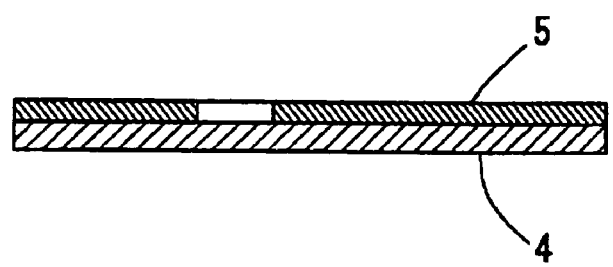
Figure 6:
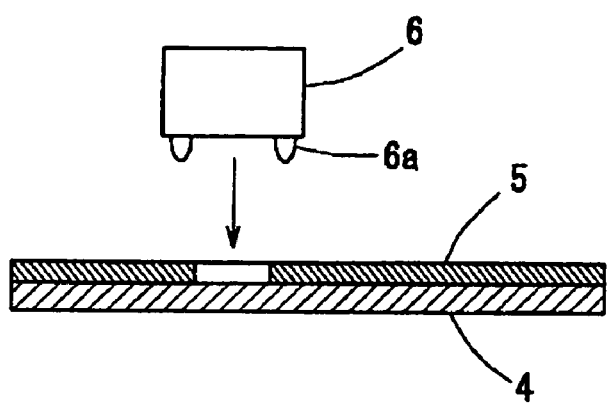
Figure 6:
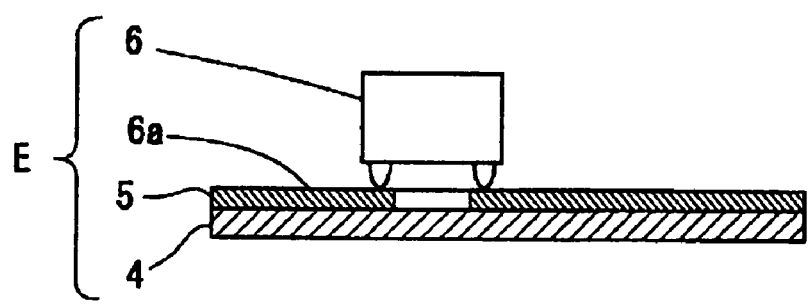

FIG. 6(*a*) to FIG. 6(*d*) illustrate the steps for forming the electronic part module E having the resin substrate 4, substrate circuit 5 and the IC chip 6.

At the step of lamination, first, there is prepared an Al-PET laminated material by adhering an aluminum foil 5' of a thickness of 20 μm on a PET film or on a resin substrate 4 having a thickness of 25 μm (FIG. 6(*a*)). This can be formed by such a method as heat-press adhesion or vacuum evaporation of aluminum like the above Cu-PET laminated material.

At the step of forming the circuit, next, the aluminum foil 5' on the above Al-PET laminated material is worked into a predetermined pattern circuit shape, i.e., into the substrate circuit 5 (FIG. 6(*b*)). The working method, here, may rely upon the known etching. However, when the circuit shape is simple, the step is better carried out by relying upon the press working since the cost can be decreased. In this embodiment, no etching resist is formed owing to the use of the press work.

At the step of mounting a semiconductor, next, the IC chip 6 is mounted on the substrate circuit 5 formed on the surface of the resin substrate 4.

The IC chip 6 is constituted as a so-called surface-mounted IC chip having connection bumps 6*a* protruding from the bottom surface thereof. Ultrasonic vibration is exerted on the gold bumps 6*a* protruding from the bottom thereof to mechanically remove the oxide layer on the surfaces of the substrate circuit 5 by vibration. The gold bumps 6*a* are further heated by the heat of friction due to vibration to effect the junction by diffusing gold atoms in aluminum.

This mounting method is executed by arranging the IC on a predetermined position and by applying ultrasonic vibration of 40 kHz under a load pressure of 0.2 kg/mm$^2$ for about several seconds (FIGS. 6(*c*)(*d*)).

Figure 7:
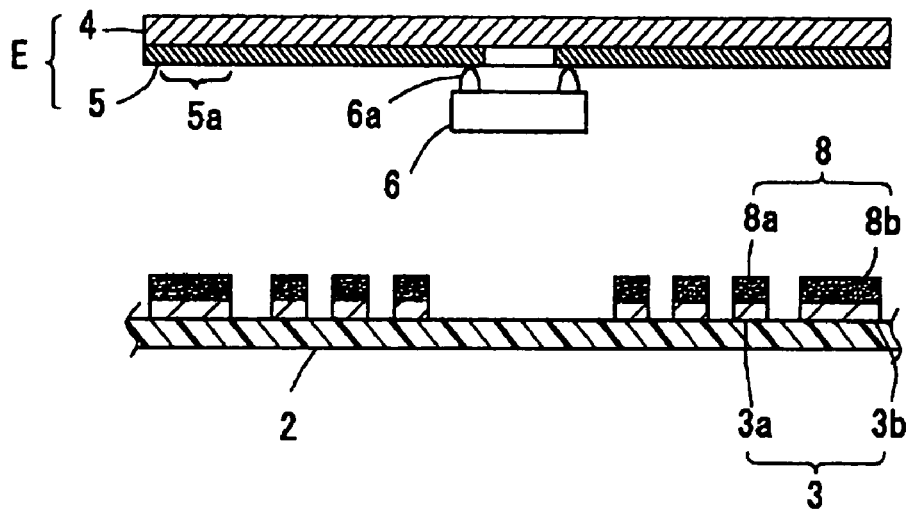
[FIG. 7]
Figure 7:
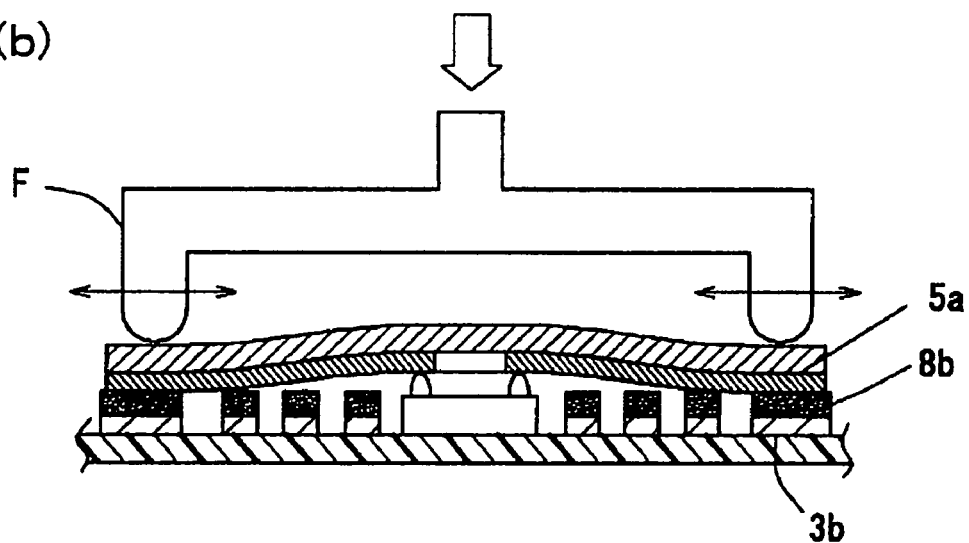
Figure 7:
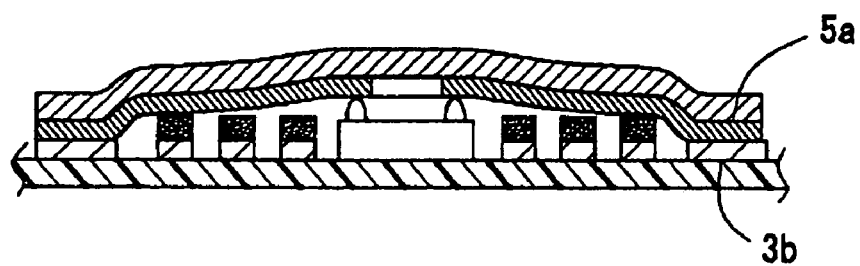

FIG. 7(*a*) to FIG. 7(*c*) illustrate the steps for mounting the electronic part module E on the antenna coil 3 of the resin base material film 2.

First, the electronic part module E is arranged on a position where the substrate circuit attaching portion 5*a* of the substrate circuit 5 faces the antenna coil attaching portion 3*b* of the antenna coil 3 (FIG. 7(*a*)).

Here, the IC chip 6 is arranged at a position that is facing when an attempt has been made to decrease the thickness by providing none of the coil portion 3*a* or the like on a portion to where the IC chip 6 of the electronic part module E faces.

This nearly uniforms the thickness of the RFID tag 1 as a whole making it possible to prevent the RFID tag 1 from being damaged and, particularly, the IC chip 6 from being damaged.

Next, a pressing rod F is pushed onto a portion right on the electronic part module E corresponding to the base circuit attaching portion 5*a* from the side of the resin substrate 4 while exerting a load pressure of 0.2 kg/mm$^2$ (thick arrow) and ultrasonic vibration of a frequency of 40 kHz (thin arrow) for about 0.5 seconds (FIG. 7(*b*)).

This method is based on the technology disclosed in Japanese Laid-Open Patent Publication (JP-A-11-333409). The substrate circuit attaching portion 5*a* of the substrate circuit 5 and the antenna coil attaching portion 3*b* of the antenna coil 3 are electrically joined together, and the electronic part module E in which the substrate circuit 5 is arranged is attached to the resin base material film 2 on which the antenna coil 3 is arranged (FIG. 7(*c*)).

In general, the welding takes place when the atoms are brought close to a distance (several angstroms) in which attraction acts among the atoms on the surfaces of the metals that are to be bonded together and when the atoms on the whole surface are brought into contact maintaining an orderly arrangement. Usually, however, the surface of a metal is covered with a thin surface layer such as of an oxide or an adsorbed gas, preventing the underlying clean metal atoms from approaching and without producing a sufficient bonding force.

According to the ultrasonic junction method, on the other hand, the layer on the surface of the metal is removed by ultrasonic vibration by means of the above method, and atoms vigorously vibrating are diffused to adhere and attach the terminal 5a of the electronic part module E to the terminal 3b on the side of the antenna coil.

Further, this method is based on a principle in that the surface layer on the metal is removed by ultrasonic vibration to realize the junction. A sufficient degree of junction characteristics are obtained between the terminals even when the step of junction is effected without peeling the insulating etching resist formed on the antenna coil through the step shown in FIG. 5(b).

The attachment or junction offers a junction strength large enough for the RFID tag 1 to work but is not so large as to peel the adhesive layer 7 off the object G to be managed or as to peel the electronic part module E off the adhesive layer 7.

Upon effecting the junction relying upon the ultrasonic vibration disclosed in the above laid-open publication, the resist layer 8b at the attaching portion is removed by vibration, and a sufficient degree of electric junction is accomplished between the terminals without peeling the insulating resist layer 8b of the attaching portion formed on the antenna coil 3 through the above step of resist printing.

When the junction of the above laid-open publication is not effected, the insulating etching resist is peeled off the antenna coil attaching portion 3b, i.e., the resist layer 8b at the attaching portion is peeled and, thereafter, the electric junction or attachment is accomplished by using an isotropically conducting paste, a conducting paste or a solder.

Finally, though not illustrated, the adhesive layer 7 is formed by applying a sticking material onto the surface of the RFID tag 1 on the side mounting the electronic part module E, i.e., on at least the sticking surface of the electronic part module on the surface for sticking the RFID tag 1 to the object to be managed.

The sticking material may be applied onto the whole surface or onto part of the sticking surface of the RFID tag 1 if it includes at least the sticking surface of the electronic part module E.

The RFID tag 1 forming the adhesive layer 7 is subject to be undesirably adhered onto any object that is not desired. From the standpoint of preserving and managing the RFID tag 1, therefore, a peeling paper that can be easily peeled may be stuck onto the surface of the adhesive layer 7 to protect it.

The adhesive layer 7 can be formed by such a method as applying a hot-melting sticking agent (e.g., S-dyne (registered trademark) 2050A, manufactured by Sekisui Kagaku Kogyo Co.) onto an electronic part-holding film by using a roll coater or the like, or laminating a double-sided tape without base material (e.g., 2-1300, manufactured by 3M).

Here, the above-mentioned sticking agent and the double-sided tape without base material have a small linking force in the layer in the transverse direction. The RFID tag 1 that is peeled in a state as shown in FIG. 4 can, therefore, be easily broken without peeling the electronic part module E; i.e., the RFID tag 1 can be destroyed while the electronic part module E being left on the surface of the object G to be managed.

In this embodiment, the antenna coil 3 can be formed without avoiding the position corresponding to the IC chip 6 (see FIG. 8(a) to 8(c)).

In this case, the IC chip 6 is overlapped on the coil portion 3a and on the coil portion resist layer 8a in the direction of thickness of the RFID tag 1. Therefore, the thickness of the RFID tag 1 as a whole increases compared to that of the above-mentioned case making it, however, easy to form the coil portion 3a, and to calculate an L-value and a Q-value necessary for the antenna coil 3.

Other constitutions and the step of production are same as those described above, and are not described here again.

Figure 9:
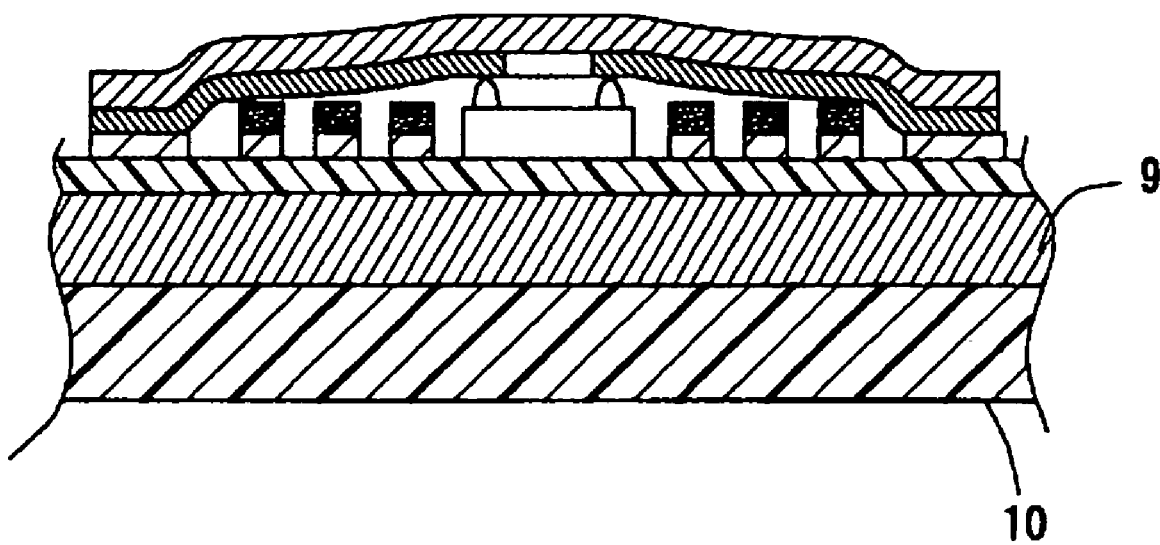
[FIG. 9]

In this embodiment as shown in FIG. 9, an overcoating layer 10 may be adhered with an adhesive layer 9 onto the opposite surface of the RFID tag 1 that is formed above, i.e., onto the surface on the side of the resin base material film 2.

Here, if the overcoating layer 10 is soft and flexible, there arouses a problem in that it becomes possible to slowly peel the RFID tag 1 off the object G in a manner that the electronic part module E is not separated away from the RFID tag 1 by inserting a tool such as a knife in the end of the electronic part module E.

Therefore, the overcoating layer 10 is constituted by a hard resin plate that cannot be easily bent, such as PBT resin plate having a thickness of not smaller than, for example, 0.1 mm. Even if it is attempted to peel the RFID tag 1 from the object G to be managed, therefore, there is no space for inserting a tool such as a cutter knife in the adhered portion between the electronic part module E and the object G to be managed, offering a particular effect of reliably making it difficult to peel off the RFID tag 1 without destroying it. This, further, increases the mechanical strength and the degree of freedom for decorating the surface.

According to this embodiment as described above, if the RFID tag 1 is peeled off, i.e., if the resin base material film 2 is peeled off, the electronic part module E remains on the surface of the object G and the RFID tag 1 is destroyed (see FIG. 4) since the adhesive layer 7 has no linking in the transverse direction and, besides, the junction strength of the junction points (antenna coil attaching portion 3b and the substrate circuit attaching portion 5a) is smaller than the sticking strength of the adhesive layer 7. Besides, the adhesive layer 7 can be formed through the same step as the one for forming an ordinary label, i.e., can be formed without requiring any particular production facility. The above destruction is based on an important factor which is a difference between the junction strength of the adhesive layer 7 and the junction strength of the junction points (antenna coil attaching portion 3b and the substrate circuit attaching portion 5a), and there is obtained a reliable destruction which is not affected by the conditions for peeling off the label. Even when a covering layer 10 (see FIG. 9) such as a paper or a resin film is stuck to the surface of the RFID tag 1 to cover it, the state of destruction is not affected by the covering layer.

Embodiment 2

Another embodiment of the invention will be described below with reference to FIG. 10(a), FIG. 10(b), FIG. 11(a) and FIG. 11(b).

Figure 10:
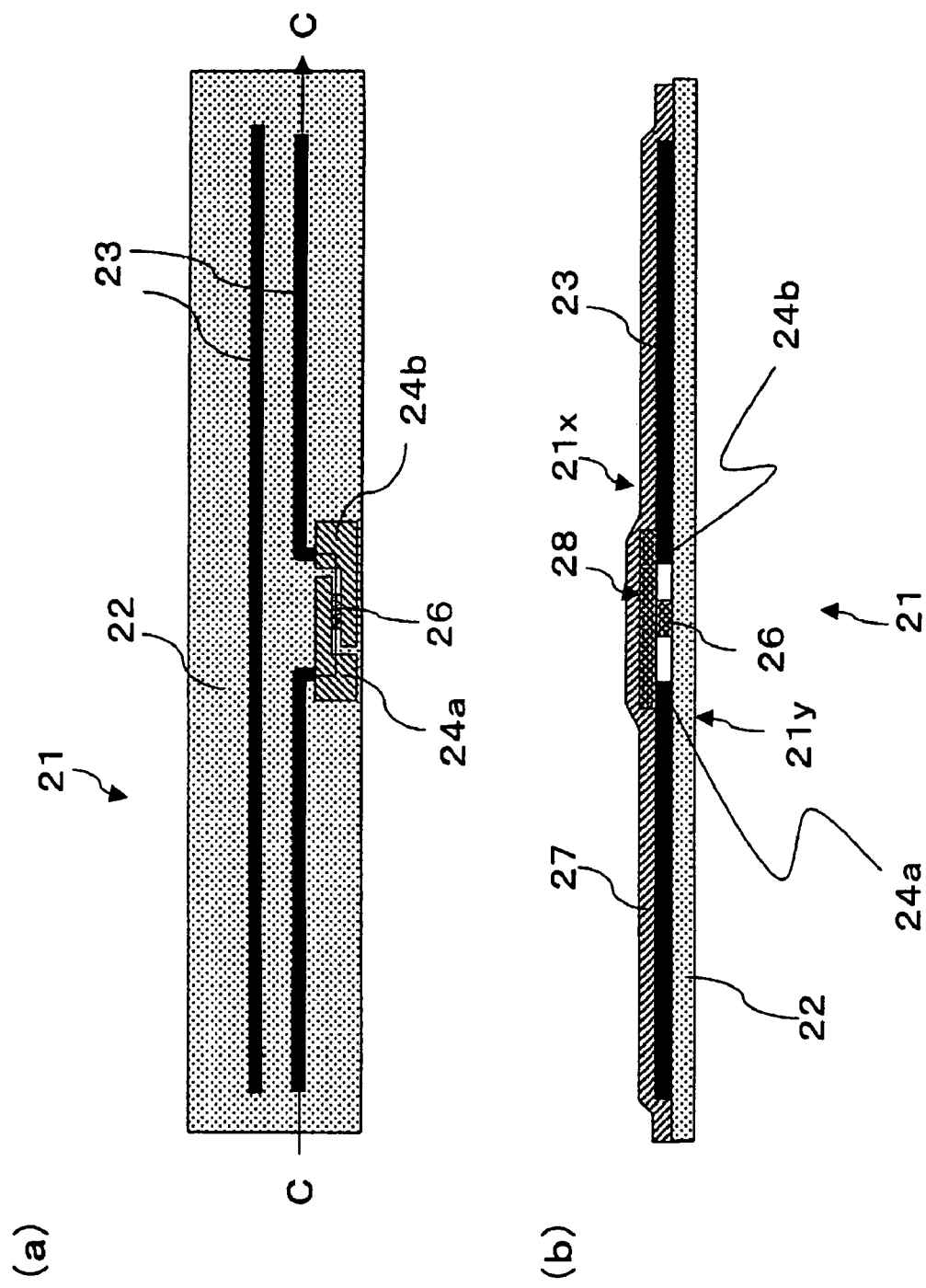
[FIG. 10]

FIG. 10(a) is a top view illustrating the constitution of the RFID tag according to the embodiment 2, and FIG. 10(b) is a front view of the RFID tag shown in FIG. 10(a). FIG. 11(a) and FIG. 11(b) are views of steps illustrating a method of using the RFID tag shown in FIG. 10(a).

The embodiment 2 uses a dipole antenna corresponding to a communication frequency of not lower than 850 MHz, which is different from the spiral coil antenna (see FIG. 1) used in the embodiment 1.

As shown in FIG. 10(a) and FIG. 10(b), the RFID tag 21 of the embodiment 2 (information carrier/information recording medium) includes a flexible resin base material film 22 (base material), a dipole antenna conductor pattern 23 (antenna), an electronic module 28 (substrate) for mounting a bare chip IC 26 (signal-forming portion, information recording circuit) and an adhesive layer 27.

On one surface 21x of the resin base material film 22 (base material), there are provided the antenna conductor pattern 23, the conductor circuits 24a, 24b (transfer portion/conductor portion) connected to the antenna conductor pattern 23, and the electronic module 28 for mounting the bare chip IC 26 (signal-forming portion/information-recording circuit). Here, the electronic module 28 is connected to the antenna conductor pattern 23 (antenna) via the conductor circuits 24a, 24b, and is attached to the resin base material film 22.

The sticking surface of the RFID tag 21 of this embodiment is a surface 21x on the side on where the electronic module 28 is mounted, and the adhesive layer 27 is formed on the sticking surface 21x inclusive of the upper surface of the electronic module 28 (surface on the side opposite to the side of the resin base material film 22). The adhesive force of the adhesive layer 27 to the object is stronger than the attaching force between the electronic module 28 and the resin base material film 22.

In the RFID tag 21, the (dipole) antenna conductor pattern 23 is formed by etching Cu of a thickness of 9 μm. Further, the resin base material film 22 is a PET (polyethylene terephthalate) film having a thickness of 38 μm. The electronic module 28 is obtained by mounting the bare chip IC 26 on an aluminum conductor circuit formed on a PET film base material of a thickness of 25 μm.

The RFID tag 21 of the embodiment 2 is the same as the RFID tag 1 of the embodiment 1 except the structure and the materials mentioned above, and is produced through the same steps as those for producing the above RFID tag 1.

Described below with reference to FIG. 11(a) and FIG. 11(b) is how to use the RFID tag 21.

First, the sticking surface 21x of the RFID tag 21 forming the adhesive layer 27 is bought into contact with the object 30 (to be managed) and the RFID tag 21 is stuck to the object 30 (see FIG. 11(a)).

In this state, the electronic module 28 is arranged between the object 30 and the resin base material film 22, the electronic module 28 being attached to the resin base material film 22 and being adhered to the object 30 due to the adhesive layer 27. Here, the adhesive force of the adhesive layer 27 to the object 30 (adhesive force of the adhesive layer 27 for adhering the object 30 and the electronic module 28 together) is greater than the attaching force between the electronic module 28 and the resin base material film 22. Therefore, the electronic module 28 is more strongly adhered to the object 30 than to the resin base material film 22.

In the above state, the person (user) who manages the object transmits electronic waves (of a frequency of, for example, not lower than 850 MHz) to the antenna conductor pattern 23 of the resin base material film 22 to read the information (specific information) from the electronic module 28 (bare chip IC 26) electrically connected to the antenna conductor pattern 23.

Here, if the RFID tag 21 is peeled off the object 30, the resin base material film 22 peels off the interface 29 (see FIG. 11(a)) between the electronic module 28 and the resin base material film 22 (conductor circuits 24a, 24b) since the electronic module 28 has been adhered more strongly to the object 30 than to the resin base material film 22.

Figure 11:
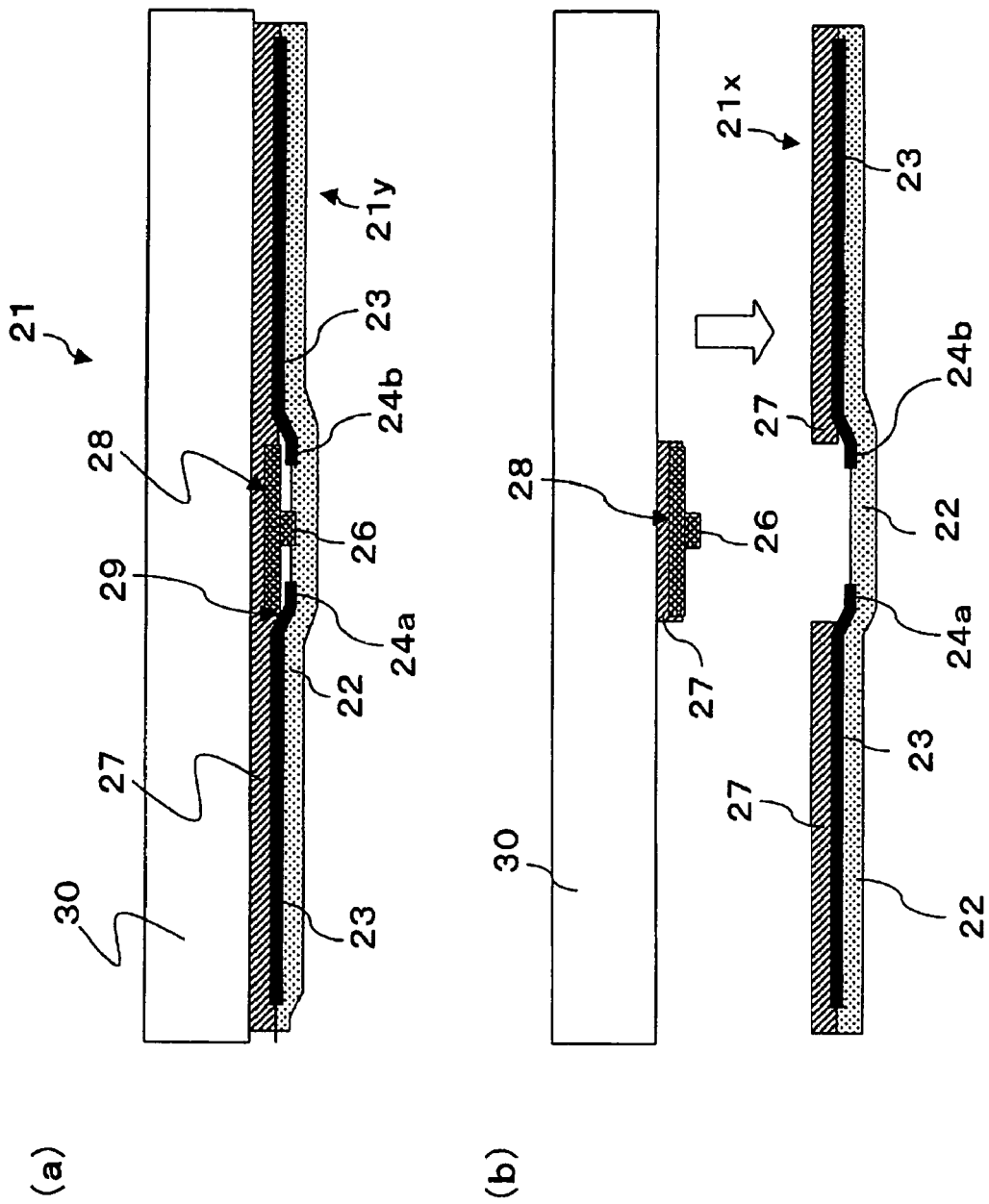
[FIG. 11]

As a result, the electronic module 28 remains on the object 30 as shown in FIG. 11(1b), and the electronic module 28 and the resin base material film 22 are separated away from each other. That is, if the RFID tag 21 is once peeled off the object 30 to which it had been adhered, the portions of the conducting circuits 24a and 24b are destroyed, and the antenna conducting pattern 23 of the resin base material film 22 is reliably cut from the bare chip IC 26 of the electronic module 28.

Thus, if the RFID 21 is once peeled off the object 30 to which it had been stuck, the information can no longer be read out from the bare chip IC26 and the function is lost. Therefore, a fraudulent deed of using the RFID tag 21 used for (stuck to) a given article to another article is reliably prevented, and the information security of the RFID tag 21 is reliably maintained.

In the RFID tag 21 of the second embodiment 2, too, it is desired that the bonding force in the adhesive layer 27 in the direction of a plane (strength of the adhesive layer 27 in the direction of a plane) is weaker than the adhesive force of the adhesive layer 27 to the object 30.

As shown in FIG. 11(b), when the RFID tag 21 is peeled off the object 30 and the electronic module 28 is separated away from the resin base material film 22, the adhesive layer 27, too, is divided into a portion that remains on the object 30 and a portion that sticks to the resin base material film 22.

Here, if the strength of the adhesive layer 27 in the direction of a plane is relatively weakened, the adhesive layer 27 is smoothly divided (in the direction of a plane) in conjunction with the separation of the electronic module 28 and the resin base material film 22 from each other. In the case the RFID tag 21 is peeled off the object 30, therefore, the antenna conductor pattern 23 (on the side of the resin base material film 22) is more reliably cut from the bare chip IC 26 (on the side of the electronic module 28)(connection portion is destroyed between the conductor circuits 24a, 24band the electronic module 28), and the information security of the RFID tag 21 is more reliably maintained.

In the RFID tag 21, too, it is desired to provide the overcoating layer (see FIG. 9) on a portion corresponding to at least the electronic module 28 on the surface 21y opposite to the sticking surface.

According to the above constitution, the resin base material film 22 positioned between the overcoating layer and the electronic module 28 is reinforced by the overcoating layer so as not to be bent. This can prevent such a fraudulent deed of inserting a tool (cutter or the like) in a gap (adhesive layer 27) between the electronic module 28 and the object 30 in order to gradually peel the RFID tag 21 off the object 30 by bending the resin base material film 22 (without destroying the connection portion between the conducting circuits 24a, 24b and the electronic module 28). It is, therefore, made possible to more reliably maintain the information security of the RFID tag 21.

The above embodiments 1 and 2 have described the cases where the information carrier (information recording medium) of the invention was applied to the RFID tag. However, the information carrier (information recording medium) of the invention can also be applied to a non-contact IC card that can be stuck to an object (IC card containing an antenna therein to transmit and receive the data by utilizing the electromagnetic waves emitted from an external terminal).

Embodiment 3

A further embodiment of the invention will be described with reference to FIG. 12(a) to FIG. 12(c) and FIG. 13(a) and FIG. 13(b).

Figure 12:
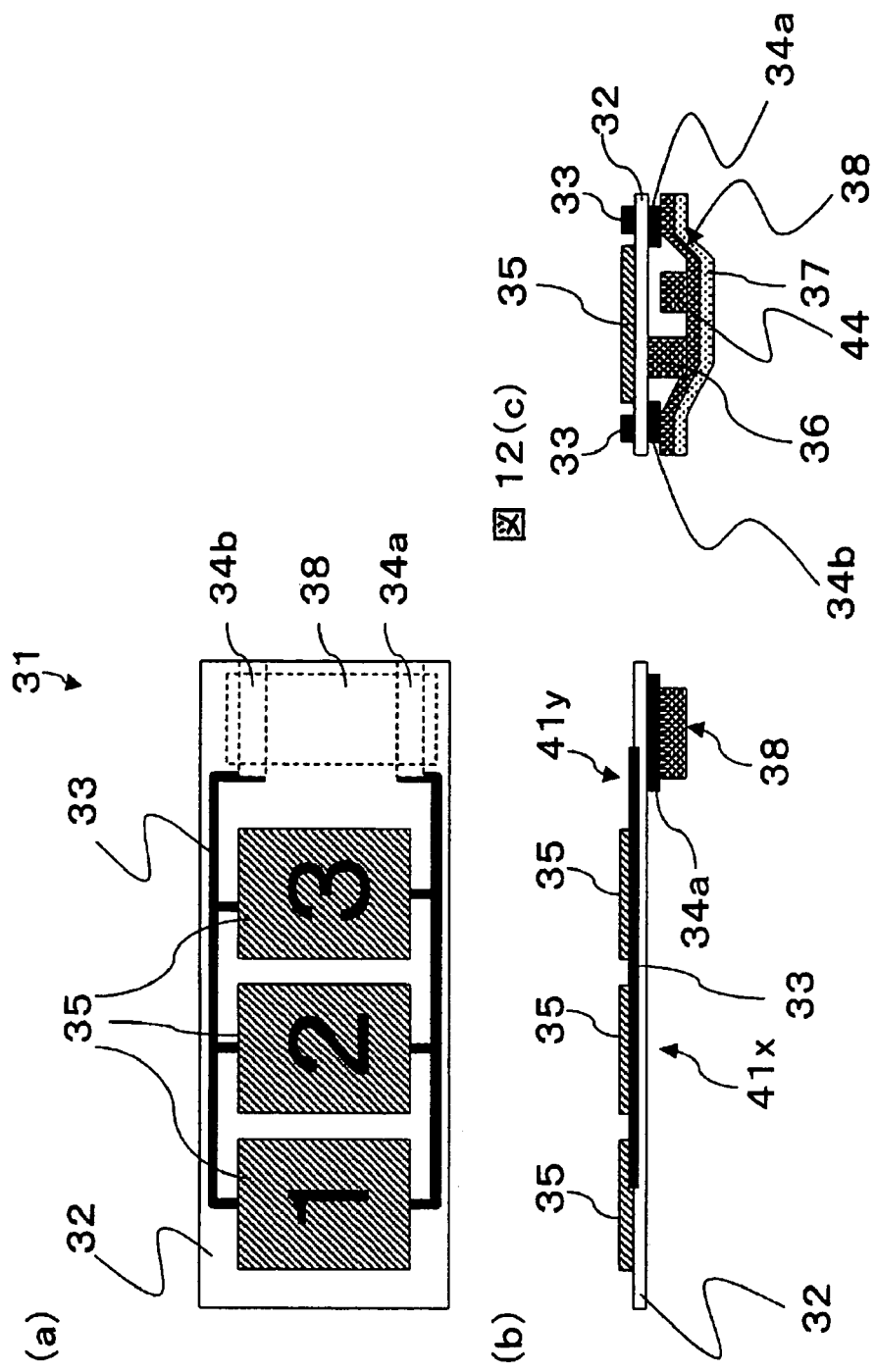
[FIG. 12]
Figure 13:
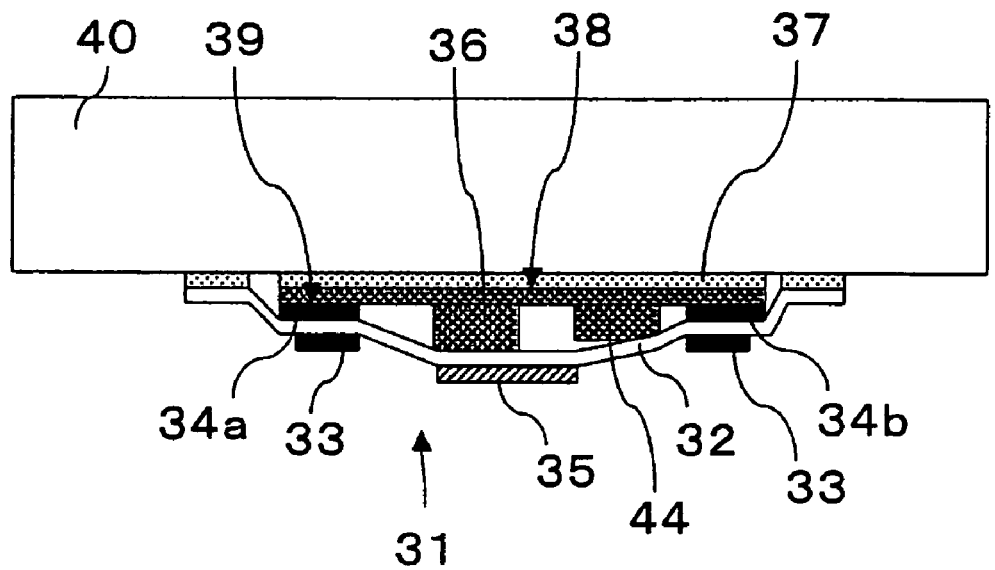
[FIG. 13]
Figure 13:
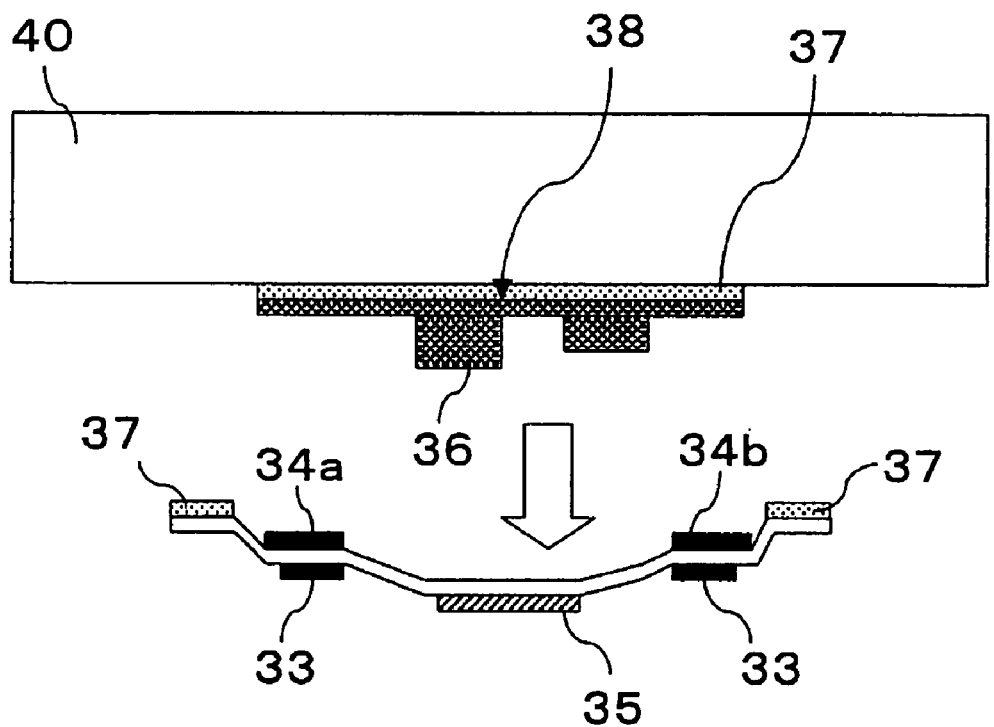

FIG. 12(a) is a top view illustrating the constitution of an IC label according to the embodiment 3, FIG. 12(b) is a front view of the IC label shown in FIG. 12(a), and FIG. 12(c) is a side view of the IC label shown in FIG. 12(a). FIGS. 13(a) and 13(b) illustrate the steps of using the IC label shown in FIG. 12(a).

Unlike the embodiments 1 and 2, the IC label of the embodiment 3 is provided with a non-communication type display for displaying information which it carries without effecting the communication with the external unit through the antenna.

As shown in FIG. 12(a) to FIG. 12(c), the IC label 31 (information carrier/information recording medium) of the embodiment 3 includes a resin base material film 32 (base material), a display portion 35, an electronic module 38 (substrate) for mounting an IC chip 36 (signal-forming portion/information recording circuit), and an adhesive layer 37.

Referring to FIG. 12(b) and FIG. 12(c), on one surface 41x of the resin base material film 32, there are provided conductor circuits 34a, 34b (transfer portion/conductor portion) and an electronic module 38 is attached (mounted) for mounting the IC chip 36 and an electronic part 44. On the other surface 41y of the resin base material film 32, there are provided a conductor pattern 33 and a display portion 35 that comprises an LED connected to the conductor pattern 33. Here, the electronic module 38 is electrically connected to the conductor circuits 34a, 34b on the resin base material film 32 and is also attached thereto, and is connected to the display portion 35 through the conductor circuits 34a, 34b (on the surface 41x) and through the conductor pattern 33 (on the surface 41y).

The sticking surface of the IC label 31 of this embodiment is the surface 41x on the side on where the electronic module 38 is mounted, and the adhesive layer 37 is formed on the upper surface of the electronic module 38 (on the surface opposite to the side of the resin base material film 32). The adhesive force of the adhesive layer 37 to the object is stronger than the attaching force between the electronic module 38 and the resin base material film 32.

In the IC label 31, the resin base material film 32 is a PET (polyethylene terephthalate) film of a thickness of 38 μm. The display portion 35 is an LED of 7 segments, and the conductor pattern 33 is formed by etching an electrically conducting material such as Cu.

The electronic module 38 is the one obtained by mounting the IC chip 36 and the electronic part 44 (resistor, capacitor, etc.) on the aluminum conducting circuits (including 34a, 34b) formed on the PET film base material of a thickness of 25 μm. The electronic module 38 is the one produced relying upon the known electronic part mounting technology or the printed circuit board fabrication technology, and is electrically connected to the conductor pattern 33 of the resin base material film 32 via the conducting circuits 34a, 34b with using the circuit connection technology based on ultrasonic waves (see Japanese Laid-Open Patent Publication "JP-A-2001-007511").

Described below with reference to FIG. 13(a) and FIG. 13(b) is how to use the IC label 31.

First, the sticking surface 41x of the IC label 31 forming the adhesive layer 37 is bought into contact with the object 40, and the IC label 31 is stuck to the object 40 (see FIG. 13(a)).

In this state, the electronic module 38 is arranged between the object 40 and the resin base material film 32, the electronic module 38 being attached to the resin base material film 32 and being adhered to the object 40 due to the adhesive layer 37. Here, the adhesive force of the adhesive layer 37 to the object 40 is greater than the attaching force between the electronic module 38 and the resin base material film 32. Therefore, the electronic module 38 is more strongly adhered to the object 40 than to the resin base material film 32.

In the above state, the person (user) who manages the object reads information of the electronic module 38 (IC chip 36) from the display of the display portion 35.

Here, if the IC label 31 is peeled off the object 40, the resin base material film 32 peels off the interface 39 (see FIG. 13(a)) between the electronic module 38 and the resin base material film 32 (conductor circuits 34a, 34b) since the electronic module 38 has been adhered more strongly to the object 40 than to the resin base material film 32.

As a result, the electronic module 38 remains on the object 40 as shown in FIG. 13(b), and the electronic module 38 and the resin base material film 32 are separated from each other. That is, if the IC label 31 is once peeled off the object 40 to which it had been adhered, the connection portions of the conductor circuits 34a and 34b are destroyed, and the display portion (conducting pattern 33) of the resin base material film 32 is reliably cut from the electronic module 38 (IC chip 36).

Thus, if the IC label 31 is once peeled off the object 40 to which it had been stuck, the information can no longer be read out from the IC chip 31 and the function is lost. Therefore, a fraudulent deed of using the IC label 31 used for (stuck to) a given article to another article is reliably prevented, and the information security of the IC label 31 is reliably maintained.

Embodiment 4

A still further embodiment of the invention will be described with reference to FIG. 14 and FIG. 15(a), FIG. 15(b).

Figure 14:
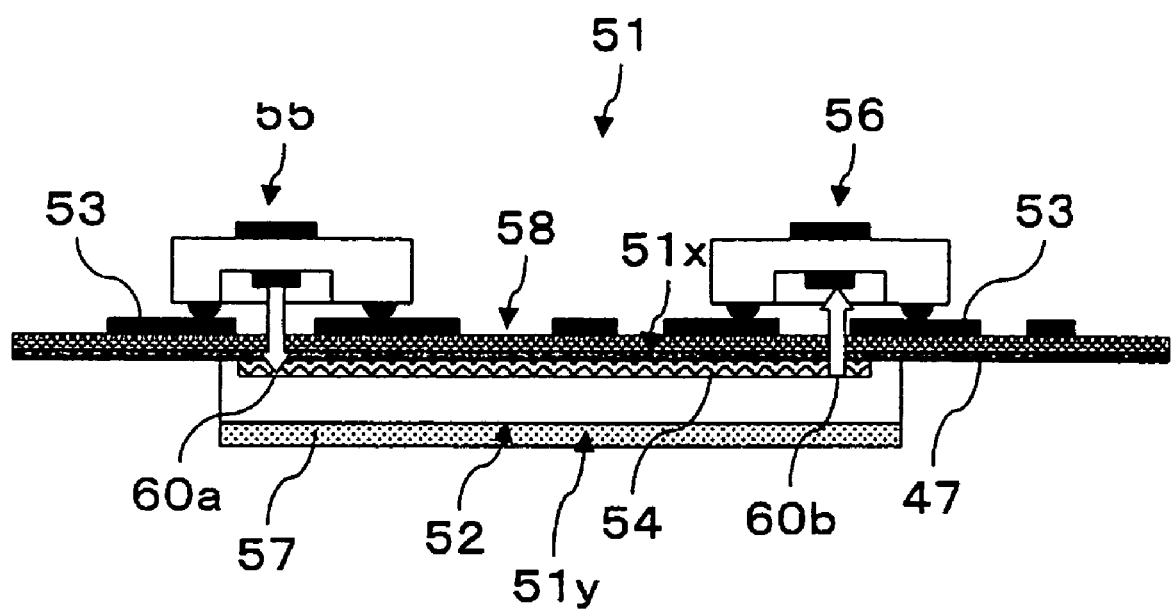
[FIG. 14]
Figure 15:
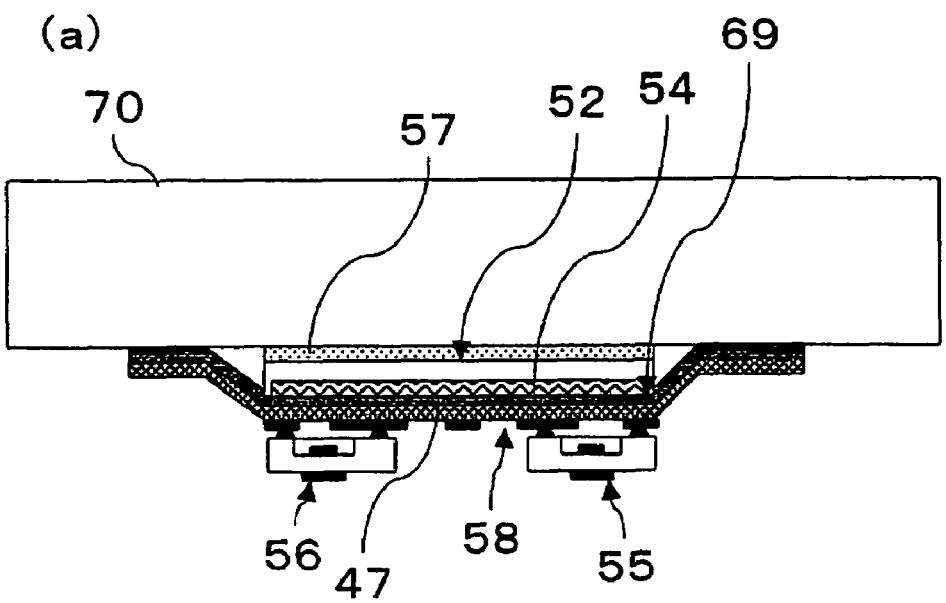
[FIG. 15]
Figure 15:
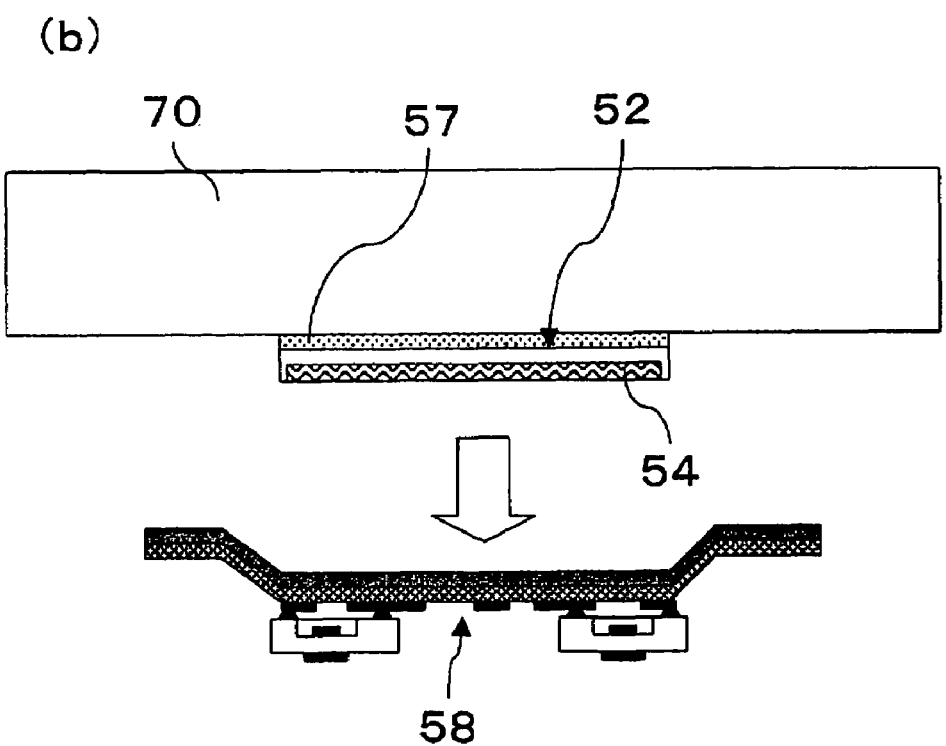

FIG. 14 is a sectional view illustrating the constitution of an optical IC label according to the embodiment 4, and FIG. 15(a) and FIG. 15(b) illustrate the steps of using the optical IC label shown in FIG. 14.

The optical IC label of the embodiment 4 is the one that uses light for forming signals corresponding to the specific information.

As shown in FIG. 14, the optical IC label 51 (information carrier) of the embodiment 4 includes printed circuit board 58 (substrate) having a signal-forming portion such as an IC chip, an optical waveguide board 52 (base material) having an optical waveguide 54 (transfer portion), and an adhesive layer 57.

Referring to FIG. 14, on one surface 51x of the optical waveguide board 52, there is provided the optical waveguide 54 on which the printed circuit board 58 is attached via an adhesive 47. The printed circuit board 58 includes a conductor pattern 53 connected to the signal-forming portion and optical devices 55, 56 connected to the conductor pattern 53.

The surface for sticking the optical IC label 51 of this embodiment is the surface 51y on the side of the optical waveguide board 52 (base material), and the adhesive layer 57 is formed on the upper surface of the optical waveguide board 52 (on the surface of the side opposite to the printed circuit board 58). The adhesive force of the adhesive layer 57 to the object is stronger than the attaching force between the printed circuit board 58 and the optical waveguide board 52.

Here, the printed circuit board 58 is the one obtained by mounting a signal-forming portion such as an IC, an optical device 55 having a semiconductor laser diode (LD) and an optical device 56 having a photodiode (PD) on the conductor pattern 53 formed by etching a conductor material such as Cu. The semiconductor laser diode converts an electric signal into light, and the photodiode converts light into an electric signal. That is, in the optical IC label 51, an electric signal from the signal-forming portion on the printed circuit board 58 is converted into light 60a through the optical device 55, light 60a is transferred at a high speed through the optical waveguide 54, sent as light 60b to the optical device 56 where it is converted into an electric signal which is, then, recognized as specific information of the optical IC label.

The optical waveguide board 52 is the one obtained by forming a core (optical waveguide 54) of an ultraviolet-ray curable resin which is a photosensitive resin to which germanium, titanium, phosphorus and the like have been added in a clad of an ultraviolet-ray curable resin which is a photosensitive resin to which fluorine, boron and the like have been added. By using the optical waveguide 54 as the signal transfer portion, it is made possible to transmit signals at a very high speed (e.g., several Gbps or higher).

An acrylic adhesive (40) is used as an adhesive 47 for adhering the optical waveguide board 52 and the printed circuit board 58 together.

Described below with reference to FIG. 15(a) and FIG. 15(b) is how to use the optical IC label 51.

First, the sticking surface 51y of the optical IC label 51 forming the adhesive layer 57 is bought into contact with the object 70 and the optical IC label 51 is stuck to the object 70 (see FIG. 15(a)).

In this state, the optical waveguide board 52 is arranged between the object 70 and the printed circuit board 58, the optical waveguide board 52 being attached to the printed circuit board 58 and being adhered to the object 70 due to the adhesive layer 57. Here, the adhesive force of the adhesive layer 57 to the object 70 is greater than the attaching force between the printed circuit board 58 and the optical waveguide board 52 based on the adhesive 47. Therefore, the printed circuit board 58 is more strongly adhered to the object 70 than to the optical waveguide board 52.

In the above state, the person (user) who manages the object can read, as specific information, the signals from the signal-forming portion through the optical device 55 (semiconductor laser diode), optical waveguide 54 and optical device 56 (photodiode).

Here, if the optical IC label 51 is peeled off the object 70, the printed circuit board 58 peels off the interface 69 (see FIG. 15(a)) between the printed circuit board 58 and the optical waveguide board 52 since the printed circuit board 58 has been adhered more strongly to the object 70 than to the optical waveguide board 52.

As a result, the optical waveguide board 52 remains on the object 70, and the printed circuit board 58 and the optical waveguide board 52 are separated from each other as shown in FIG. 15(b). That is, if the optical IC label 51 is once peeled off the object 70 to which it had been adhered, the optical relationship is destroyed between the optical waveguide 54 of the optical waveguide board 52 and the optical devices 55, 56 of the printed circuit board 58.

Thus, if the optical IC label 51 is once peeled off the object 70 to which it had been stuck, the information can no longer be read out from the optical IC chip 51 and the function is lost. Therefore, a fraudulent deed of using the optical IC label 51 used for (stuck to) a given article to another article is reliably prevented, and the information security of the optical IC label 51 is reliably maintained.

Embodiment 5

A yet further embodiment of the invention will be described with reference to FIG. 16.

Figure 16:
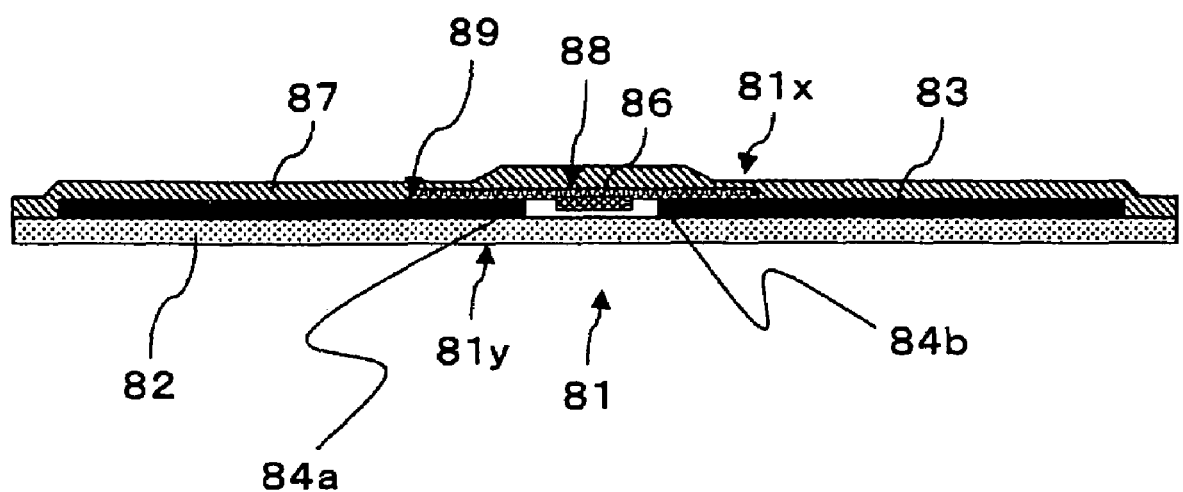
[FIG. 16]

FIG. 16 is a sectional view illustrating the constitution of a sensor according to the embodiment 5.

As shown in FIG. 16, the sensor 81 includes a board 82 (base material), a conductor pattern 83, a sensor module 88 (substrate) having a sensor chip 86, and an adhesive layer 87.

On one surface 81x of the board 82 (base material), there are provided the conductor pattern 83 and the conductor circuits 84a, 84b (transfer portion) connected to the conductor pattern 83, and the sensor module 88 is attached thereto. Here, the sensor module 88 (sensor chip 86) is connected to the conductor pattern 83 through the conductor circuits 84a, 84b and is further attached to the board 82.

The surface for sticking the sensor 81 of this embodiment is the surface 81x on the side to where the sensor module 88 is attached, and the adhesive layer 87 is formed on the sticking surface 81x inclusive of the upper surface of the sensor module 88 (surface on the side opposite to the side of the board 82). The adhesive force of the adhesive layer 87 to the object is stronger than the attaching force between the sensor module 88 and the board 82.

Described below is how to use the sensor 81.

First, the sticking surface 81x of the sensor 81 forming the adhesive layer 87 is bought into contact with the object 80, and the sensor 81 is stuck to the object 80.

In this state, the sensor module 88 is arranged between the object 80 and the board 82, the sensor module 88 being attached to the board 82 and being adhered to the object 80 due to the adhesive layer 87. Here, the adhesive force of the adhesive layer 87 to the object 80 (force of the adhesive layer 87 for adhering the object 80 and the sensor module 88 together) is greater than the attaching force between the sensor module 88 and the board 82. Therefore, the electronic module 88 is more strongly adhered to the object 80 than to the board 82.

In the above state, the sensor module 88 (sensor chip 86) senses the state (vibration, temperature, etc.) specific to the object 80, forms a signal thereof and transfers it to the conductor pattern 83 through the conductor circuits 84a, 84b. The transferred signal is transmitted from, for example, the conductor pattern 83 enabling the user to recognize the state of the object 80. Here, the sensor 81 of this embodiment has been set to be in agreement with the characteristics of the object 80.

Here, if the sensor module 88 is peeled off the object 80, the board 82 peels off the interface 89 (see FIG. 16) between the sensor module 88 and the board 82 (conductor circuits 84a, 84b) since the sensor module 88 has been adhered more strongly to the object 80 than to the board 82.

As a result, the sensor module 88 remains on the object 80, and the sensor module 88 and the board 82 are separated away from each other. That is, if the sensor 81 is once peeled off the object 80 to which it had been adhered, the portion of the conductor circuits 84a, 84b (connection portion between the sensor module 88 and the conductor pattern 83) is destroyed, and the sensor chip 86 of the sensor module 88 is reliably cut from the conductor pattern 83 of the board 82.

Thus, the sensor 81 cannot be used again if it is once peeled off the object 80 (object having characteristics in agreement with those of the sensor 81) to which it had been stuck, so that the sensor cannot be used for the undesired object, i.e., so that the sensor cannot be used for the object having characteristics which are not in agreement with the characteristics possessed by the sensor 81.

In the above embodiments, the RFID tags 1, 21, (non-communication type) IC label 31 and optical IC label 51 correspond to the information carrier/information recording medium, the resin base material films 2, 22, 32, optical waveguide board 52 and board 82 correspond to the base material, the antenna coil 3 and antenna conductor pattern 23 correspond to the antenna, the electronic part modules E, 28, 38, printed circuit board 58 and sensor module 88 correspond to the substrate, the IC chips 6, 36, bare chip IC 26 and sensor chip 86 correspond to the signal-forming portion or the information recording circuit (electronic part), the adhesive layers 7, 27, 37, 57 and 87 correspond to the adhesive layer, and the overcoating layer 10 corresponds to the reinforcing member. Here, however, the information carrier/information recording medium of the invention is not limited to the constitutions of the above embodiments only, but may provide many embodiments with using as many combinations thereof as possible.

CONCLUSION

Concrete embodiments in the detailed description of the invention are to clarity the technical contents of the invention, which, therefore, should not be taken in a narrow sense being limited to the embodiments only, but should be so interpreted that the invention can be put into practice being modified in a variety of ways without departing from the spirit and scope of the invention.

INDUSTRIAL APPLICABILITY

The information carrier (information recording medium) according to the invention can be widely applied to the wireless communication type RFID tags (IC tags), non-contact type IC cards and to the non-communication type IC labels.

The invention claimed is:

1. An information carrier in which a substrate having a signal-forming portion for forming signals corresponding to specific information is attached to a base material having a transfer portion for transferring the signals, and the specific information is recognized by relying upon the signals transferred from the signal-forming portion through the transfer portion, wherein an adhesive layer is formed on the surface of the substrate on the side opposite to the surface thereof on the side of the base material, the adhesive layer having an adhesive force to an object to be stuck which is greater than an attaching force between the substrate and the base material.

2. An information carrier in which a substrate having a signal-forming portion for forming signals corresponding to specific information is attached to a base material having a transfer portion for transferring the signals, and the specific information is recognized by relying upon the signals transferred from the signal-forming portion through the transfer portion, wherein an adhesive layer is formed on the surface of the base material on the side opposite to the surface thereof on the side of the substrate, the adhesive layer having an adhesive force to an object to be stuck which is greater than an attaching force between the base material and the substrate.

3. An information carrier in which a substrate having an information recording circuit is attached to a base material having a conductor portion in a manner that the conductor portion and the information recording circuit are electrically connected together, and information in the information recording circuit is read out through the conductor portion, wherein an adhesive layer is formed on the surface of the electronic part substrate on the side opposite to the surface thereof on the side of the base material, the adhesive layer having an adhesive force to an object to be stuck which is greater than an attaching force between the electronic part substrate and the base material.

4. An information carrier according to any one of claims 1 to 3, wherein the bonding force in the adhesive layer in the direction of a plane is weaker than the adhesive force of the adhesive layer to the object.

5. An information carrier according to any one of claims 1 to 3, wherein a reinforcing member is provided for at least a portion corresponding to the substrate on the surface of the side opposite to the surface that is to be stuck.

6. An information carrier according to claim 3, wherein the base material is provided with an antenna connected to the conductor portion.

7. An information carrier according to claim 3, wherein a display portion connected to the conductor portion is provided on the surface of the base material on the side opposite to the surface thereof to where the substrate is attached.

8. A sensor comprising:

a substrate having a signal-forming portion for detecting a state of an object and for forming a signal corresponding to the state; and a base material to which the substrate is attached and having a transfer portion for transferring the signal;

wherein an adhesive layer is formed on the surface of the substrate on the side opposite to the surface thereof on the side of the base material or on the surface of the base material on the side opposite to the surface thereof on the side of the substrate, the adhesive layer having an adhesive force to the object that is greater than the attaching force between the substrate and the base material.

9. An information recording medium comprising a base material on which an antenna coil is arranged, and an electronic part substrate mounting an electronic part that constitutes an information recording circuit and is attached to the base material while the information recording circuit electrically is connected to the antenna coil, wherein the surface of the information recording medium on the side to where the electronic part substrate is attached is used as a surface for sticking the information recording medium to an object, and an adhesive layer is formed on at least the surface of the electronic part substrate that is to be stuck, the adhesive layer having an adhesive force to an object to be stuck which is greater than an attaching force between the substrate and the base material.

10. An information recording medium according to claim 9, wherein the adhesive force of the adhesive layer is set to be stronger than the strength of attachment between the electronic part substrate and the base material.

11. An information recording medium according to claim 9 or 10, wherein the bonding force in the adhesive layer in the direction of a plane is set to be weaker than the adhesive force of the adhesive layer in the direction of thickness.

12. An information recording medium according to claim 9 or 10, wherein a hard member that does not bend in the direction of thickness is adhered onto the surface of the information recording medium on the side opposite to the surface thereof that is to be stuck at a portion at least corresponding to the electronic part substrate.

13. An information recording medium according to claim 11, wherein a hard member that does not bend in the direction of thickness is adhered onto the surface of the information recording medium on the side opposite to the surface thereof that is to be stuck at a portion at least corresponding to the electronic part substrate.

* * * * *